(12) United States Patent
Williams, Jr.

(10) Patent No.: US 7,160,753 B2
(45) Date of Patent: Jan. 9, 2007

(54) SILICON-ON-INSULATOR ACTIVE PIXEL SENSORS

(75) Inventor: George Melville Williams, Jr., Portland, OR (US)

(73) Assignee: Voxtel, Inc., Beaverton, OR (US)

( * ) Notice: Subject to any disclaimer, the term of this patent is extended or adjusted under 35 U.S.C. 154(b) by 169 days.

(21) Appl. No.: 10/877,942

(22) Filed: Jun. 25, 2004

(65) Prior Publication Data

US 2005/0205930 A1    Sep. 22, 2005

Related U.S. Application Data

(60) Provisional application No. 60/521,229, filed on Mar. 16, 2004.

(51) Int. Cl.
*H01L 21/00* (2006.01)

(52) U.S. Cl. .................... 438/73; 438/200; 257/E31.01

(58) Field of Classification Search ............ 438/48–98, 438/141–231
See application file for complete search history.

(56) References Cited

U.S. PATENT DOCUMENTS

| | | | |
|---|---|---|---|
| 5,726,440 A * | 3/1998 | Kalkhoran et al. ...... 250/214.1 |
| 5,747,840 A | 5/1998 | Merrill |
| 6,023,293 A | 2/2000 | Watanabe |
| 6,066,510 A | 5/2000 | Merrill et al. |
| 6,242,324 B1 * | 6/2001 | Kub et al. .................. 438/455 |
| 6,380,572 B1 | 4/2002 | Pain et al. |
| 6,391,744 B1 | 5/2002 | Hudak et al. |
| 6,504,196 B1 | 1/2003 | Rhodes |
| 6,721,464 B1 | 4/2004 | Pain et al. |
| 6,852,591 B1 * | 2/2005 | Rhodes ...................... 438/244 |
| 2002/0018133 A1 | 2/2002 | Medis et al. |
| 2002/0033439 A1 | 3/2002 | Bock |
| 2002/0121655 A1 * | 9/2002 | Zheng et al. ............... 257/291 |
| 2002/0175269 A1 | 11/2002 | Krymski |
| 2002/0192911 A1 | 12/2002 | Parke |
| 2003/0016906 A1 | 1/2003 | Utsunomiya |
| 2003/0122210 A1 * | 7/2003 | Cohen et al. ............... 257/465 |
| 2003/0133625 A1 | 7/2003 | Pain et al. |
| 2004/0080646 A1 | 4/2004 | Zhao et al. |
| 2004/0114853 A1 * | 6/2004 | Bjorkman et al. ............ 385/14 |
| 2004/0169740 A1 | 9/2004 | Pain et al. |
| 2005/0184354 A1 * | 8/2005 | Chu et al. .................... 257/458 |
| 2005/0282306 A1 * | 12/2005 | Yamanaka ................... 438/57 |

OTHER PUBLICATIONS

Emsley et al., "Silicon Substrates with Buried Distributed Bragg Reflectors for Resonant Cavity-Enhanced Optoelectronics," IEEE J. Selected Topics in Quant. Electr. 8:948-955 (Jul./Aug. 2002).

(Continued)

*Primary Examiner*—Savitri Mulpuri
(74) *Attorney, Agent, or Firm*—Klarquist Sparkman, LLP

(57) ABSTRACT

Active pixel sensors are defined on double silicon on insulator (SOI) substrates such that a first silicon layer is selected to define radiation detection regions, and a second silicon layer is selected to define readout circuitry. The first and second silicon layers are separated by an insulator layer, typically an oxide layer, and the layers can be independently doped. Doping can be provided in the silicon layers of the SOI substrate during assembly of the SOI substrate, or later during device processing. A semiconductor substrate that supports the first and second layers can be removed for, for example, back side radiation detection, using a second insulator layer (typically an oxide layer) as an etch stop.

34 Claims, 13 Drawing Sheets

OTHER PUBLICATIONS

Ünlü et al., "High-Speed Si Resonant Cavity Enhanced Photodetectors and Arrays," J. Vac. Sci. Technol. 22:781-787 (May/Jun. 2004).

Emsley et al., "High-Efficiency, 10 Ghz Bandwidth Resonant-Cavity-Enhanced Silicon Photodetectors Operating at 850 nm Wavelength," Proc. IEEE Lasers and Electro-Optics Society 2:839-840 (Nov. 2001).

Xu et al., "A low voltage hybrid bulk/SOI CMOS active pixel image sensor," IEEE Electron Devices Lett. 22:248-250 (May 2001).

Zhang et al., "Building Hybrid Active Pixels for CMOS Imager on SOI Substrate," 1999 IEEE International SOI Conference (Oct. 1999).

Emsley et al., "Realization of High-Efficiency 10 GHz Bandwidth Silicon Photodetector Arrays for Fully Integrated Optical Data Communication Interfaces," Proceedings of the 33$^{rd}$ European Solid-State Device Research Conference, pp. 47-50 (Sep. 2003).

Emsley et al., "High-Speed Resonant-Cavity-Enhanced Silicon Photodectors on Reflecting Silicon-On-Insulator Substrates," IEEE Photon. Technol. Letters 14:519-521 (Apr. 2002).

James Janesick "Charge coupled CMOS and hybrid detector arrays," SPIE, San Diego, Focal Plane Arrays for Space Telescope, paper #5167-1, Aug. 2003.

Zhang, M. Chan, H. Wang, Ko., P.K., "Building Hybrid Active Pixels for CMOS Imager on SOI Substrate" IEEE SOI Conf Oct. 1999.

Fowler et al., Low Noise Readout using Active Reset for CMOS APS, Pixel Device International Inc.

Pain et al., "A Single-chip Programmable Digital CMOS Imager with Enhanced Low-light Detection Capability," California Institute of Technology, Jet Propulsion Laboratory.

Chen et al., "CMOS active pixel sensor achieving 90 dB dynamic range with column-level active reset."

Tian et al., "Analysis of Temporal Noise in CMOS APS," SPIE, 3649:177-185 (Jan. 1999).

Y. Degerli, "Monolithic active pixels with in-pixel amplification and reset noise suppression for charged particle detection in a 0.25 μm digital CMOS process," internal report, CEA-Saclay, DAPNIA/SEDI, pp. 1-6 (Jul. 8, 2003).

Fowler et al., "Reset Noise Reduction in Capacitive Sensors," IEEE Trans. on Cir. and Sys., pp. 1-11 (Jul. 13, 2005).

O. Yadid-Pecth, "Wide-dynamic-range sensors," Opt. Eng., 38:1650-1660 (Oct. 1999).

Stoppa et al., "Novel CMOS Image Sensor With a 132-dB Dynamic Range," IEEE Jour. of Solid-State Cir., 37:1846-1852 (Apr. 2002).

Pain et al., Photodiode-Based CMOS APSs With Zero-Lag, Low-Noise, High-Linearity Design, NASA's Jet Propulsion Laboratory (Nov. 2000).

V. Gromov, Development of the Bandgap Voltage Reference Circuit, Featuring Dynamic-Threshold MOS Transistors (DTMOST's) in 0.13um CMOS Technology.

J. Robenson, "Investigation on a Dynamic Threshold Voltage Control via Body Bulk-Biasing as a Forth Terminal on a CMOS Process Technology," Journal of Undergraduate Research, vol. 4, pp. 1-6 (Jun. 2003) http://www.clas.ufl.edu/jur/200306/papers/paper_robensen.html, accessed: Oct. 11, 2005.

Bogaerts et al., "Total Dose Effects on CMOS Active Pixel Sensors."

J. Janesick, "Dueling Detectors ," SPIE's OEMagazine pp. 30-33 (Feb. 2002).

* cited by examiner

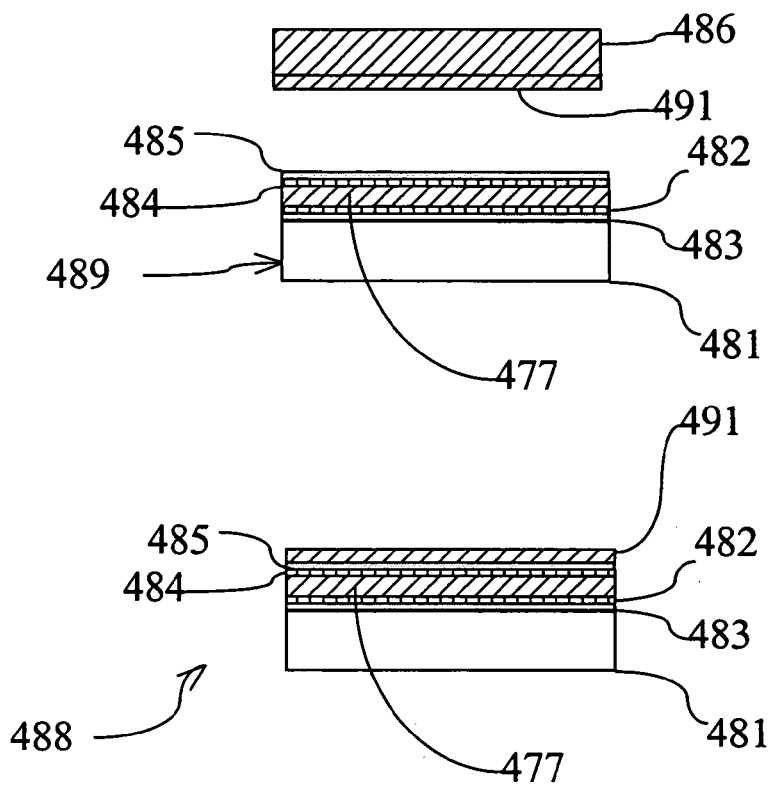
FIG. 4N
FIG. 4O
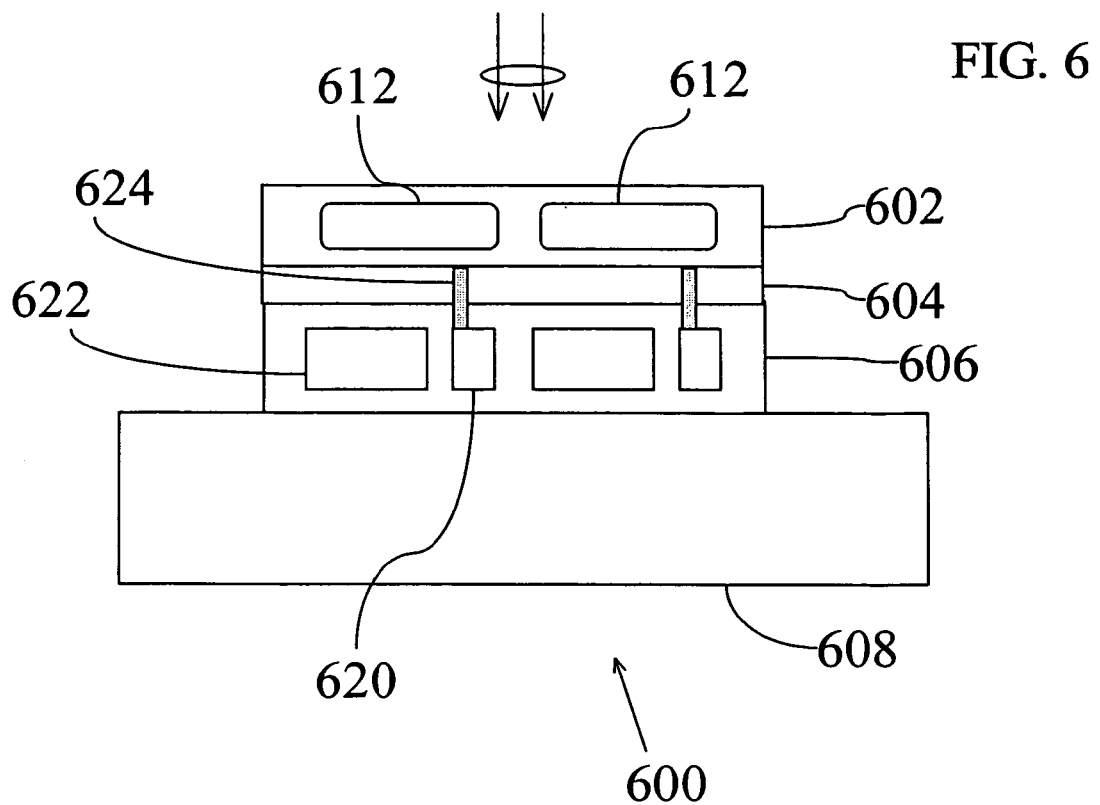
FIG. 6

SILICON-ON-INSULATOR ACTIVE PIXEL SENSORS

RELATED APPLICATIONS

This application claims the benefit of U.S. Provisional Application No. 60/521,229, filed Mar. 16, 2004 which is incorporated herein by reference.

TECHNICAL FIELD

The disclosure pertains to semiconductor imaging devices and methods of manufacturing such devices.

BACKGROUND

Image sensors find applications in a wide variety of fields, including machine vision, robotics, astronomy, navigation, as well as consumer products. While complementary metal-oxide-semiconductor (CMOS) technology has provided the foundation for advances in low-cost, low-power, reliable, highly integrated systems for many consumer applications, charge coupled devices (CCDs) have been, until recently, the primary technology used in electronic imaging applications. CCDs, however, are high capacitance devices that require high voltage clocks, consume large amounts of power, provide only serial output, and require specialized silicon processing that is incompatible with CMOS technology.

The availability of sub-micron CMOS technology and the advent of active pixel sensors (APS) have made CMOS technology more attractive for imaging applications. Active pixel sensors have transistors within a pixel unit cell to provide amplification and use manufacturing processes that are compatible with CMOS processes. Small pixel sizes, low noise, high speed, and high dynamic range have been demonstrated in such CMOS imagers using a variety of designs. The expected scaling of MOS devices to even smaller geometries will improve the operation and application of CMOS-based integrated circuits, but such scaling can adversely affect the performance of imagers. For example, the scaling of MOS devices in imagers requires a continued increase in channel doping and lower operating voltages, thus leading to significantly reduced depletion widths on the order of less than 0.1 µm. Photoelectrons generated within a depletion region are efficiently collected while photoelectrons generated outside the depletion region are collected only inefficiently, and can diffuse into adjacent pixels. Because silicon has an indirect band gap, absorption lengths in silicon tend to be long.

For photons having a wavelength in the range of 400–800 nm, the photon absorption depth in silicon varies from about 0.1 µm to about 16 µm. For example, at a wavelength $\lambda=700$ nm, a silicon absorption constant $\alpha$ is about $3 \cdot 10^3$ cm$^2$, corresponding to an absorption length $\alpha^{-1}$ of about 3.3 µm at room temperature. Even longer absorption lengths, as long as several hundred microns, are associated with photon wavelengths approaching the bandgap of silicon. However, the depth $X_d$ of a depletion layer varies as $X_d \approx (2\epsilon_{si}\Phi/eN_A)^{1/2}$, wherein $\Phi$ is a depleting potential, $N_A$ is an acceptor concentration, $\epsilon_s$ is a permittivity of silicon, and e is electron charge. In a typical 0.5 µm CMOS technology, the depletion widths are less than 0.2 µm. With the exception of light at blue wavelengths, many photons in the visible spectrum are absorbed outside the depletion region. Therefore, CMOS imagers implemented using an unmodified sub-micron CMOS technology generally exhibit a lower quantum efficiency and increased cross-talk compared to imagers implemented with a lower resolution fabrication process. Increased cross-talk can lead to degraded color performance and smear.

The breakdown voltage of MOS structures limits the applied potential, and hence the use of high resistivity silicon (low $N_A$) is required. Using a silicon charge collection region with low doping concentration (e.g., $2*10^{13}/$cm$^3$), a 10-µm thick optical cavity can be fully depleted at about 1.8 volts. However, the low $N_A$ doping is most often incompatible with conventional CMOS processes.

Another problem in imagers made using bulk-CMOS technology is a rise in photodiode leakage current when exposed to radiation. This rise in leakage current is caused by the use of Local Oxidation of Silicon (LOCOS) processes to create isolation regions. For example, as shown in FIG. 7, an oxide isolation region 702 is configured to separate a photodiode and a MOSFET. A so-called "bird's beak" feature 704 at a transition between a thin-gate oxide region 706 and the isolation region 702 is associated with high electric fields, thereby causing increased trap-generation during exposure to radiation. Although using a radiation-hard fabrication process can reduce leakage currents, such processes are relatively expensive and add to the overall imager cost.

In contrast to bulk-CMOS technology, silicon-on-insulation (SOI) CMOS technologies use SOI wafers that include three layers, a single-crystal layer of silicon, upon which integrated circuits are fabricated, a base silicon substrate and a thin insulator that electrically insulates the single-crystal layer and the substrate. This thin insulator reduces parasitic capacitance typically associated with a circuit device and a substrate in conventional bulk processes. Such SOI process can produce devices that exhibit lower power consumption and higher processing speeds than conventional bulk devices. Device operation in SOI-based devices is similar to that of bulk devices, except that transistors and other circuit elements do not share a common substrate.

While SOI-MOS devices can provide several advantages over bulk-MOS devices, the thin silicon layer of such devices makes them unsuitable for imagers. In particular, the SOI silicon layers are too thin to efficiently absorb visible and near-infrared light. Pain and et al., U.S. Pat. No. 6,380,572 and Zhang et al., "Building Hybrid Active Pixels for CMOS Imager in SOI Substrate," 1999 IEEE International SOI Conference (1991), disclose active pixel sensors in which photodetectors are formed in a bulk silicon substrate and circuit elements are formed in a SOI silicon layer that is separated from the bulk silicon by a buried oxide layer in a thin silicon film formed on an insulator layer disposed on the substrate. Such devices provide a thick charge collection region, but bulk silicon used for such SOI manufacturing generally is not suited for photodetector manufacture. Furthermore, bulk silicon is difficult to thin for back-illuminated operation. Conventional back-thinning processes require a back-surface implant and activation process that typically requires temperatures above 800° C. Thus, these thinning processes are incompatible with standard CMOS metallization processes, and require complex post-processing techniques that are generally difficult to control.

In view of these and other shortcomings, improved active pixel sensors and manufacturing processes for such sensors are needed.

SUMMARY OF THE INVENTION

CMOS photodiode, photogate, avalanche photodiode, or other electromagnetic radiation or particle radiation sensors that can be incorporated into, for example, imagers, can be fabricated using a stacked multiple layer silicon-on-insulator (SOI) wafer process by integrating photodetectors or charge detection regions in a first (typically, a lower) SOI layer. Pixel readout circuitry, such transistors for source follower, transimpedance, and transconductance amplifier circuits and multiplexing circuits, are formed in a second (typically, an upper) SOI thin layer. A method of fabricating such active pixel sensors or an imagers includes forming a photodetector (or charged-particle sensor) in a first silicon layer or epilayer and forming electrical circuit elements in a second silicon layer that is separated from the first silicon layer by an insulator layer, typically, an oxide layer. Interconnections among the electrical circuit elements and the photodetector are provided to allow signals sensed by the photodetector to be read out via the electrical circuit elements.

The wafers can be made using different types of silicon and can be made using float zone (FZ) or Czochralski grown silicon, conventional or neutron transmutation doped silicon, or can be formed using epitaxial silicon growth. The insulating layers can be made using materials that facilitate the electrical and optical performance of the sensor, that facilitate wafer manufacturing (for example, through wafer to wafer bonding), or that facilitate semiconductor and sensor processing.

The first and the second layers can be optimized or otherwise independently configured during manufacturing to maximize or otherwise select a detection sensitivity and chip functionality. In an example, a method of fabricating an image sensor includes forming silicon islands on a buried insulator layer disposed on a silicon layer, and selectively etching the buried insulator layer to define a window associated with a photodetector area. A dopant (or dopants) of a first conductivity type can be diffused or implanted to form a signal node in the photodetector area and can simultaneously form drain/source regions for a first transistor in at least a first one of the silicon islands. A dopant (or dopants) of a second conductivity type is used to diffuse or implant a substrate contact and can simultaneously form drain/source regions for a second transistor in at least a second one of the silicon islands. Isolation rings around in the photodetector area can also be formed during implantation of the dopant of the second type.

In a representative example, after forming silicon islands on the buried insulator layer, photodiode and substrate contact dopant implants are made through the buried oxide. This allows an improvement in the planar topology of the device and facilitates subsequent processing. Contact is made to the implants later in the processing by forming a window in the buried oxide by, for example, through an etching process, and using metal layers to make contact between the photodiode and substrate, connecting them to transistors on the silicon islands.

In another representative embodiment, an N+ substrate contact (e.g., phosphorous doping) can be implanted and annealed prior to p+ (boron doping) to provide gettering of silicon contaminants to remove or reduce impurities in the first silicon layer. Interconnections are provided so that signals sensed by the photodetector can be sensed via at least one of the first transistor and the second transistor and read-out via circuitry formed in the second silicon layer.

In some examples, an active pixel sensor includes a photodetector such as, for example, a photodiode, photogate, avalanche photodiode, or other type of photodetector. Electrical circuit elements associated with signal sensing and readout are formed in a first silicon layer and can include multiple transistors. Circuitry on the first layer can be formed using CMOS, bipolar, SOI CMOS, or other semiconductor processes. Readout circuitry can include, for example, a reset switch, a buffer switch, and/or a row selection switch. For example, a buffer switch can comprise a source follower input transistor connected in series with a row selection switch so that when the row selection switch is activated, a signal from the active pixel sensor is transferred to a column bus.

The use of SOI CMOS transistors on SOI wafers can eliminate the need for the high-energy ion implantation processes that form deep n-type and p-type "twin" wells and field channel stop isolation regions that are presently required in leading edge bulk CMOS IC fabrication. Also, the formation of deep "triple well" structures using high energy ion implantation processes is unnecessary with SOI wafers to achieve voltage (electrical) isolation from the substrate.

In bulk CMOS photodetector processes, a photodiode such as, for example a n+/p photodiode, uses a p well to form the photodiode, and sensing, amplification, and readout circuitry is generally limited to n-well devices. The use of only one type of transistor limits design flexibility and limits the dynamic range of the sensor. Because in SOI processes, the doping of the photodiode is in a first layer and is isolated from circuitry in a second layer, both n-type and p-type transistors can be used to form circuits for charge sensing, amplification, and readout. This allows sensing and amplification circuits that contain both p-type and n-type transistors as typically needed for efficient implementation of transimpedance and transconductance amplifiers.

In some embodiments, a reset switch includes a p-type MOS transistor. In additional examples, readout circuitry includes a transistor having a transfer gate and a sense node. Charge collected by a photodetector is transferred to the sense node via a floating diffusion region and through the transfer gate.

In additional representative examples, an imager includes multiple active pixel sensors, circuitry for driving the active pixel sensors, and row and column decoders for selecting one or more pixels whose signals are to be read-out. Pixels can be configured using multiple-SOI processes to provide high quantum efficiency, low noise, low cross-talk, and pixels can be densely packed on a substrate. Other features of representative pixels include large charge handling capacities, large dynamic ranges, low power consumption high-speed operation, and radiation hardness. Arrays of such pixels can be readout randomly, binned, or windowed, and non-destructive signal readout can be provided.

A representative fabrication method includes providing a multiple layer silicon-on-insulator (SOI) wafer on a silicon substrate. Typically, the SOI wafer includes alternating layers of silicon oxide ($SiO_x$) and silicon layers. The frontmost silicon layer has a first surface and a second surface with the second surface proximal to the oxide layer. Array circuitry is formed on the first surface of the front layer. Contact is made to the lower silicon layer or layers by either patterning the wafer with a photoresist and etching through the upper silicon and buried oxide layer, and diffusing or implanting dopants into the buried layer (the lower silicon layer) to form one or more photodetectors and substrate contacts, or by implanting the buried silicon layer (the lower silicon layer) through the insulator and later in the semiconductor process making electrical contact to the lower silicon layer by etching through the buried oxide and forming a contact to the lower silicon layer, by for example, using one or more of the metals of the semiconductor process.

To create a back-illuminated device, a supporting handle substrate of ceramic, glass, quartz, metal, silicon, or other material can be fused or adhesively bonded to the front surface of the wafer, and which can be planarized to enhance bonding. The thick silicon substrate can be removed to expose the lower buried oxide layer. To promote detector efficiency for short wavelength optical photons, energetic electrons, or other charged particles that would otherwise be absorbed by such a buried oxide layer, a selective etch can be applied to the lower buried oxide layer to expose the silicon charge absorption and charge collection layer.

In further representative examples, a double SOI wafer is configured to include first and second silicon layers that are electrically isolated with an interlayer insulator. A photodetector charge collection region is defined in the first layer, and charge sensing, amplification, and readout circuits are provided in the second layer. Accordingly, the second layer can be processed by doping or otherwise to provide high speed, low noise, high dynamic range, and radiation-hard mixed-signal circuits using CMOS or SOI CMOS transistor technology. The first silicon layer can be configured for back-illuminated charge absorption and collection. A lower buried oxide layer that separates the first silicon layer and the silicon substrate can serve as a convenient 'etch stop' for device thinning. In addition, the buried oxide layer can be configured of one or more materials so that, after thinning, the buried oxide layer serves as an anti-reflection coating. Readout circuitry can include reset and source follower transistors on a top SOI layer while photodiodes are fabricated in a lower silicon layer or other layers that can be lightly doped (e.g., $N_A=2*10^{13}/cm^3$) as high resistivity n-type or p-type material.

During multi-SOI wafer construction, layers associated with charge detection and readout and layers for signal absorption and charge collection can be electrically isolated and configured independently. Photodiodes (e.g., p+/n photodiodes) can be formed by an etching step that uses, for example, additional masks with respect to conventional SOI process in order to remove a portion of a buried oxide layer (BOX) and expose a buried silicon layer. If the BOX layer is removed, the p+ region of the diode and the n+ substrate contact can be doped during source/drain implant. Alternatively, after formation of the silicon islands on the BOX layer, the p+ photodiode region and the n+ substrate contact can be doped through the BOX layer, and electrical contact can be made to the implant later in the process by removing a portion of a BOX layer and expose a buried silicon layer so that metal layers can be used to electrically connect the implanted device structures to circuits on the second silicon layer. Reset transistors can be either n-MOSFETs or p-MOSFETs, and are generally configured to be in communication with a photodiode and a supply voltage. Because the doped potential wells of the photodiode charge collection regions are not formed in the same layer as readout circuitry, both n-type and p-type MOSFETs can be used for the signal sensing, amplification, and readout circuitry without an increase in pixel size, enhancing device dynamic range and reducing minimum operating voltages.

Because the charge collection region of the first silicon layer is separated from the circuitry of the second semiconductor layer, a variety of transistor technologies, including those for conventional CMOS, bi-polar, bi-CMOS, and SOI CMOS transistor types can be used to form the circuits on the second silicon layer. CMOS technology will typically require a thicker silicon layer wherein p-well and n-wells are implanted.

A preferred transistor technology is SOI CMOS wherein transistors are formed in isolated islands which allow ready access to the second buried oxide layer and hence to the first silicon layer. SOI CMOS transistor processes designed for use with SOI wafers are classified by a thickness of a device-quality single-crystal silicon layer relative to source-drain junction depths and device channel depletion layer depths with operating voltages applied. Most commercial CMOS ICs are fabricated on SOI wafers with "thin" silicon surface layers (100–300 nm). In SOI CMOS processes, the ultra-shallow junction formation process may be designed so that the junction depth is determined by the silicon layer thickness, rather than the ion implantation and annealing processes. A SOI CMOS transistor is classified as "partially depleted" (PD) if the silicon surface layer is thicker than the depth of the depletion region in the transistor's channel. The SOI CMOS transistor is classified as "fully depleted" (FD) if the silicon surface layer is equal to the depth of the depletion region in the transistor's channel. A transistor will be partially depleted or fully depleted depending on the silicon layer thickness above the BOX layer and the doping concentration in the channel.

For back-illuminated operation, a reflective surface can be formed to reflect photons passing through the charge absorption layer back to the charge absorption layer thereby enabling light to make two passes through the charge absorption region. The wafer can be mounted to a handle substrate, and the silicon substrate wafer etched to a buried oxide layer that is configured to serve as an etch stop and as an anti-reflection coating.

At room temperature, optical radiation with wavelengths shorter than 800-nm is generally substantially absorbed in a 10-μm thick charge absorption region, as well as significant portions of the longer wavelengths. A portion of longer wavelength radiation that reaches the front surface can be reflected by the metallized or otherwise reflective front surface layer back to the absorption region. A double pass through a 10-μm thick silicon charge absorption layer fully absorbs all wavelengths shorter than about 900 nm.

Sensor performance as exposed to ionizing radiation can be configured using conventional radiation hardening processing, implementing radiation mitigation functions including sub-pixel and sub-frame event removal, using up-the-ramp slope sampling, and reducing pixel volume. In an ionizing radiation environment, the benefits of the smaller pixel volume associated with the ability to form thin SOI layers reduces the susceptibility to the transient effects of multiple electron-hole pairs produced by charged cosmic rays, gamma rays, neutrons, and proton events, and increases radiation hardness against non-ionizing displacement damage to the silicon by decreasing the radiation cross-section. While sub-frame and sub-pixel removal of the signal from electron-hole pairs created by transient radiation can be performed in larger pixels, such radiation mitigation comes at the cost of signal amplitude. With small pixels and high frame rate readout, signal losses associated with radiation event removal are limited to a fraction of a pixel or integration time. Small pixels also exhibit lower thermal noise and thus have superior noise performance.

Atomic displacement caused by impacts of heavy particles (p, n, π, . . . ) results in lattice damage and creates traps in the band-gap. For example, particles with energies of just 25 eV can displace silicon atoms from their lattice points. The resulting crystal lattice contains voids where the silicon atoms have been displaced and clusters where the silicon atoms have come to rest. The significant lattice displacement damage by non-ionizing energy loss (NIEL) mechanisms cause changes that are deleterious for detector lifetime. The most challenging are an increase of the diode volumetric leakage current, due to the introduction of generation centers, and a variation of the full depletion voltage, due to the introduction of deep acceptor defects. A depletion voltage increase requires a corresponding increase in the bias voltage applied to the detector. The resulting increased leakage current gives rise to an increase in noise and ultimately to the thermal runaway of the detector. By using low doping concentrations and selecting a suitable charge collection layer thickness, a fully depleted charge collection region can be formed, reducing signal lost due to recombination outside of the photodiode, reducing resolution degradation due to diffusion, and decreasing capacitance. Such low doping can be obtained by forming charge collection regions with, for example, high-resistivity (lightly doped) silicon.

The first silicon layer is chosen to have a thickness that is selected to enhance or optimize absorption length wherein capacitance and carrier transit time are reduced or minimized. The transit time of photodetectors is a function of the device thickness and the applied bias. Just as increasing the absorption length will increase the optical absorption efficiency, decreasing the thickness of the first silicon layer (charge collection layer) will increase detector bandwidth due to the reduction of carrier transit time. Carriers absorbed outside of the first silicon layer are prevented from drifting or diffusing into the photodetector by the buried oxide layers that contact the first silicon layer. This effect is limited in conventional CMOS sensors, as decreasing the absorption thickness causes the photodetector capacitance between the n and p contacts to increase, resulting in the degradation of the device bandwidth. The first silicon layer doping profiles and thickness can be optimized or otherwise selected during wafer manufacturing and/or during semiconductor manufacturing/device processing. As an example, dopants can be diffused or implanted into the first silicon layer during wafer manufacture so to provide an electric field potential profile or to provide a low impedance contact.

In avalanche photodiode operation, absorbed photon create electron-hole pairs, and a high reverse bias voltage (up to 2 KV) creates a strong internal field that accelerates the electrons through the silicon and produces secondary electrons by impact ionization. The resulting electron avalanche can produce gain factors up to several hundred. The maximum reverse bias voltage that can be applied to a p-n diode is limited by breakdown. Breakdown is characterized by the rapid increase of the current under reverse bias. The corresponding applied voltage is referred to as the breakdown voltage. The breakdown voltage is a key parameter that is a function of the electric field and the silicon doping.

These and other features and advantages will become more apparent in view of the following Detailed Description that proceeds with reference to the accompanying drawings.

BRIEF DESCRIPTION OF THE DRAWINGS

FIGS. 4J–4O illustrate a representative method of fabrication of a double SOI substrate wherein at least one silicon layer is doped during fabrication of the SOI substrate.

FIG. 6 is a sectional view of a portion of a two dimensional back-illuminated imager configured to detect both light and charged particles.

DETAILED DESCRIPTION

Disclosed below are representative embodiments of methods, apparatus, and systems associated with optical and charged particle sensors. For convenience, these examples are described in a particular sequential order using specific combinations of features. The disclosed methods, apparatus, and systems should not be construed as limiting in any way. Instead, the present disclosure is directed toward all novel and nonobvious features and aspects of the various disclosed embodiments, alone and in various combinations and subcombinations with one another. Further, the disclosed methods, apparatus, and systems are not limited to any specific aspect, feature, or combinations thereof, nor do the disclosed methods, apparatus, or systems require that any one or more specific advantages be present or problems be solved. Method steps are described in a particular order for convenience only, and other orders can generally be used.

Figure 1A:
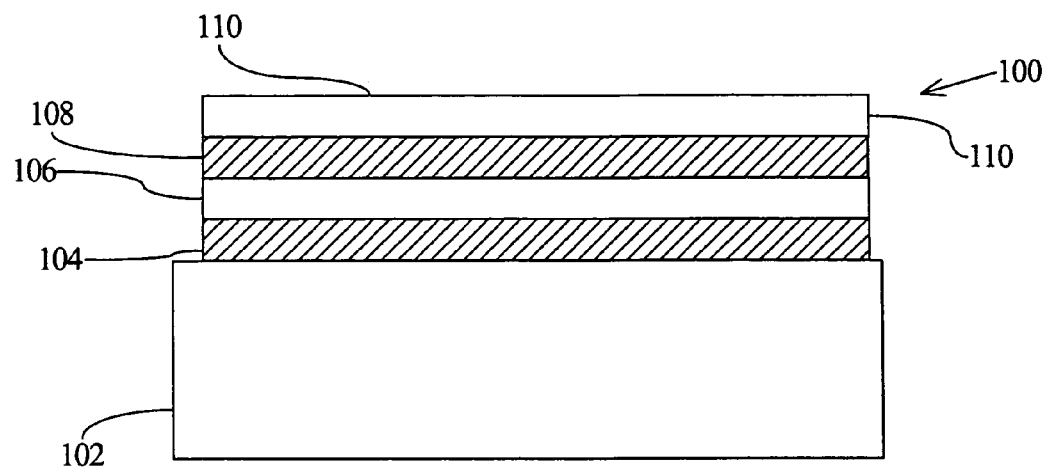
FIG. 1A is a cross-section of a representative double silicon-on-insulator (SOI) substrate.

Sensitive, radiation-tolerant imagers can be fabricated based on silicon wafers on which multiple silicon-on-insulator (SOI) layers are formed. Hybrid imagers based on charge coupled device (CCD) and complementary metal-oxide-silicon (CMOS) technologies can be manufactured by integrating detector signal absorption and charge collection functions in a lower buried SOI layer and by forming pixel sensing, amplification, and readout circuitry in an upper (SOI) silicon layer. The buried SOI layer and the upper SOI layer can be separated by a buried oxide (BOX) layer, and these layers can be configured for particular imager functions. A representative substrate 100 for such an imager is shown in FIG. 1A. A first BOX layer 104 is situated on a silicon wafer or other substrate 102. A buried silicon layer (SOI layer) 106 is provided on the first BOX layer 104, and a second BOX layer 108 and an upper silicon layer (SOI layer) 110 are provided.

Figure 1B:
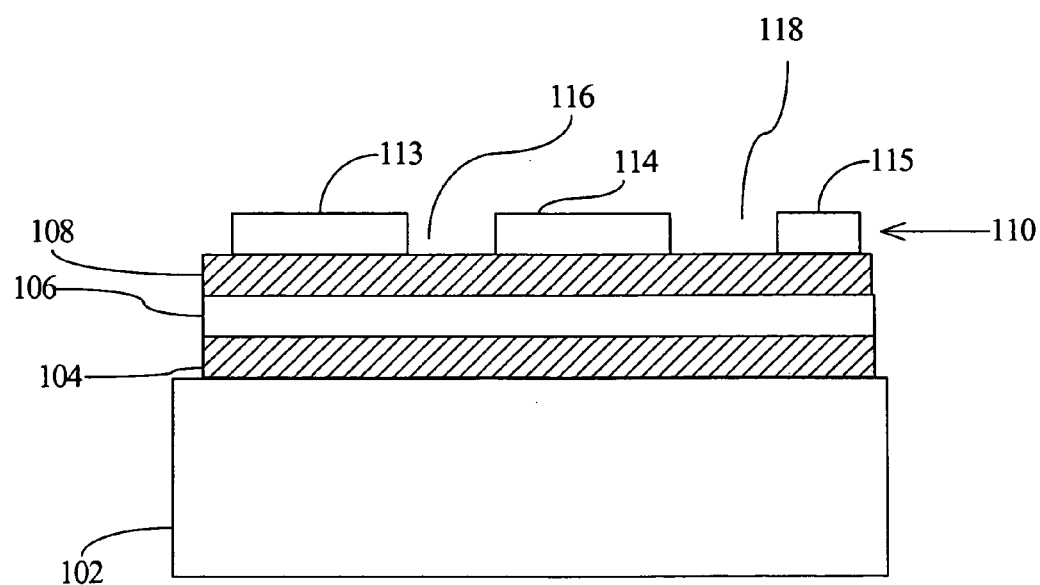
FIG. 1B is a cross-section of a representative double silicon-on-insulator (SOI) substrate with the topmost silicon layer etched to leave silicon islands in which transistors can be formed.

Typically, the various layers are patterned to define readout circuitry or photodetectors or other imaging circuitry. For example, as is shown in FIG. 1B, SOI CMOS islands 113, 114, 115 can be defined in the upper silicon layer 110, and the SOI layer 106 configured as a charge absorption layer. The silicon layer 110 can be selectively etched to define one or more windows 116, 118 or other apertures situated at selected regions of the charge absorption layer. Interconnections among readout circuitry defined in the SOI islands 113, 114, 115, such as transistors or other circuit devices, and photodetectors defined in the SOI layer 106 can be provided so that optical signals sensed by the photodetectors can be read out via transistors formed on, for example, silicon islands formed in the SOI layer 110. A thickness of the photo-absorption layer can be precisely controlled and silicon material parameters tailored by doping species, doping concentration, doping concentration depth profiles or material composition in the SOI layer 106. The SOI layer 110 can be configured as needed to define readout circuitry.

An imager can be thinned for back-illumination by removing the silicon substrate 102 that supports the SOI and BOX layers. For example, the SOI substrate 100 can be mounted with the detector face down (i.e., mounted with the SOI layer 110 or a nearby layer such as a surface passivation layer of the SOI layer 110) to a handle substrate, and the thick silicon substrate 102 removed using conventional etch methods in which the BOX layer 104 serves as an 'etch stop.' Thinning-induced lattice-damage is electrically isolated from the charge collection layer 106 by the lower BOX layer 104, and the SOI charge collection region in the SOI layer 106 is substantially unchanged. After thinning, the lower BOX layer 104 can be retained as a passivation layer or as an anti-reflection coating.

The SOI layer 106 can be configured as a charge collection layer for various imaging applications as, for example, either n-type or p-type silicon, and can be implanted with dopants to accumulate or deplete the BOX-silicon interfaces of charge carriers. Dopants can be introduced through the apertures 116, 118 in the second silicon layer 110 and through the second BOX layer 108 so that the dopants are implanted into the first silicon layer 106 so as to intentionally impart a charge in the silicon to reduce interface leakage current generation, which can be collected in the photodiode. The electric field profiles induced by doping introduced at one or both surfaces of the first silicon layer 106 (the charge collection layer) during wafer fabrication of the SOI substrate 100 or during semiconductor processing can be used to allow electrical contact to the first silicon layer 106 or to tailor the electric fields in the first silicon layer 106 so that charge carriers are more efficiently swept to and collected in the potential well of the photodiode.

Surfaces can be provided with a reflective coating, such as a metal coating, that reflects light transmitted through the absorption region back to the absorption region, thereby increasing detector efficiency. For front side illumination, the first BOX layer 104 can be configured as a reflective coating so that light transmitted through readout circuitry in the upper silicon layer 110 and the charge collection layer (the SOI layer 106) is reflected back through the charge collection layer.

Figure 2A:
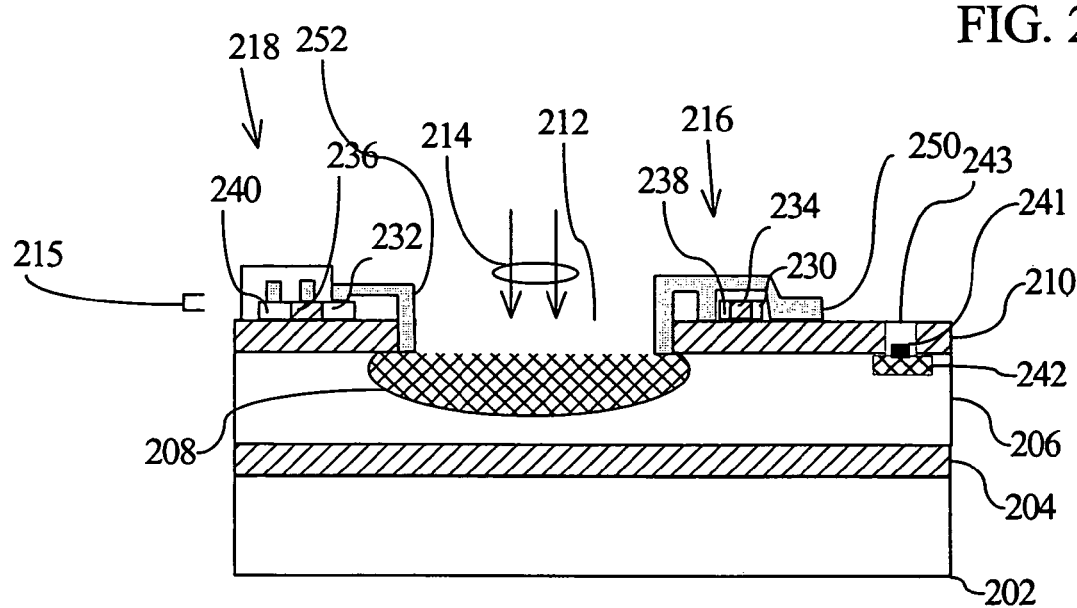
FIG. 2A is a schematic diagram of a portion of a representative front-illuminated active pixel sensor (APS) imager.

FIG. 2A shows a portion 200 of a representative active pixel sensor (APS) imager that includes an array of active pixel photodiode sensors. The array can include individual pixel sites and circuitry for driving the photogate pixels and/or circuitry for driving photodiode pixels. The APS imager includes a silicon substrate 202, a BOX layer 204 such as a silicon dioxide layer, and SOI layers 206, 215. The SOI layer 206 for a detector of visible optical radiation typically has a thickness of less than about 14 µm and can be configured as high resistivity n-type or p-type silicon for efficient low bias, partial or full depletion of the charge collection layer. For longer wavelength operation at or near the bandgap limits of silicon, the SOI layer 206 can be made thicker than about 50 µm and can be configured as high resistivity silicon so that the layer can be depleted when a voltage is applied across the layer. For imaging of ultraviolet light, vacuum UV, soft x-ray, or energetic electrons, the silicon layer 206 can be made less than approximately 2 µm thick to better match the low voltage depletion width to improve imager resolution and increase radiation hardness.

As shown in FIG. 2A, only selected portions of the second silicon layer 215 remain, and other portions can be removed during semiconductor processing. A photodiode 208 is defined by dopant implant or diffusion into the SOI layer 206. A BOX layer 210 includes an aperture 212 for transmission of front side illumination 214. A substrate contact implant 242 is defined in the SOI layer 206. The BOX layer 210 includes an aperture 243 for connecting the circuits formed in the second silicon layer 215 to the contact 242 with a metal interconnect 241. The APS imager also includes a row decoder 216 for selecting a particular row of pixels and a column decoder 218 for selecting a particular column of pixels, as well as source-follower signal chain circuitry or other active circuitry. For example, a SOI layer 215 can be processed to, for example, form transistors that include sources 230, 232, gates 234, 236 and drains 238, 240. Interconnects 250, 252 can also be provided. The signal chain circuitry can include, for example, enhancement mode and/or depletion mode source-followers. An on-chip controller (not shown) can be configured to control the operation of the decoders, the drivers and the pixels.

As shown in FIG. 2A, the APS imager 200 can be fabricated using a SOI-CMOS process by integrating the photodetectors on buried silicon layers instead of in the topmost SOI layers. The buried silicon layer doping can be chosen independently of MOS channel doping because the photodetector or charge collection substrate is not used for active devices, and properties of layers associated with readout and detection can be independently selected. In addition, because the photodiode 208 is formed by p-type or n-type doping in a separate layer, both NMOS and PMOS are available for readout circuits in the second silicon layer which allows flexibility in circuit design and allows more compact circuits with lower noise, greater dynamic range, and lower operating voltage to be used. In addition, electrical cross-talk can be reduced because of low parasitic capacitances and the isolation of individual transistors formed on MESA-isolation regions on the second silicon layer separated by a low-k dielectric layer, such as silicon dioxide and separated from the photodiode by the second insulating layer 210.

Furthermore, by separating the substrate used for the charge collection region (the first silicon layer 206) from that used for the CMOS circuits (the second silicon layer 215), the substrates can be biased independently. This allows the charge collection region 206 bias to be adjusted so that an electrical field favorable to signal collection or to forward or reverse bias the photodiode can be selected without influencing the substrate bias of the second silicon layer 215. Substrate bias can be used, for example, to compensate for the bias on the photodiode as charge is collected so that the depletion layer is maintained at a uniform width, or the bias can be used to turn the photodiode ON and OFF by forward and reverse biasing the silicon substrate.

Figure 2B:
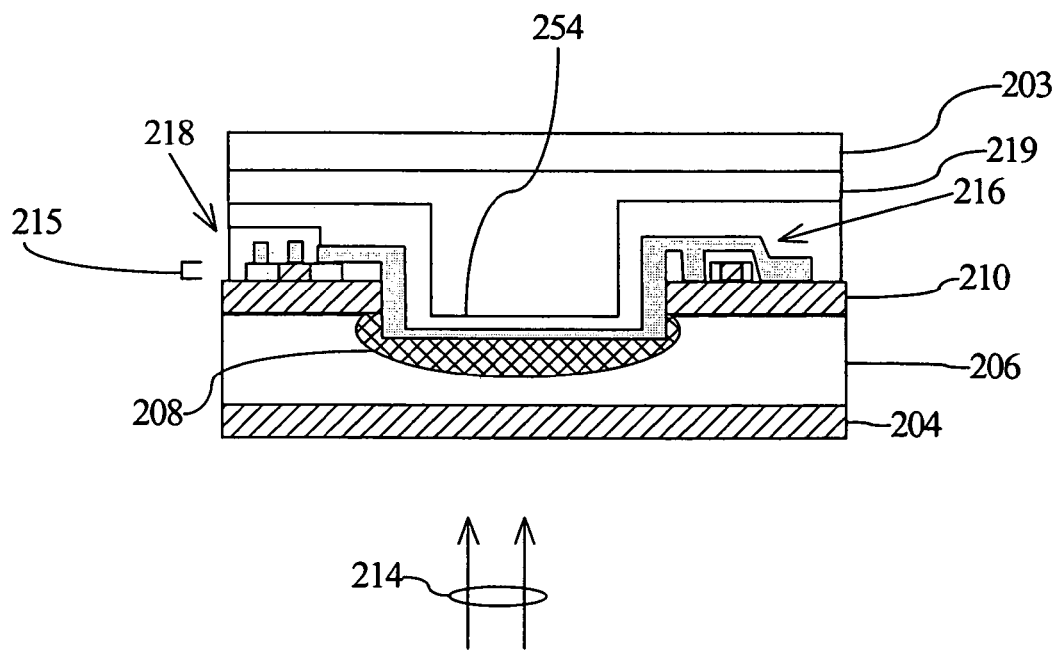
FIG. 2B is a schematic diagram of a portion of a representative back-illuminated APS imager.

FIG. 2B shows a portion 253 of a representative active pixel sensor (APS) imager that includes an array of active pixel sensors and that is configured for back illumination. In this and subsequent figures, like reference numerals are used for like features for convenience. APS imager of FIG. 2B is similar to that of FIG. 2A, but the device is mounted to a substrate 203 and the silicon substrate 202 is removed so that the imager is configured to receive radiation through the first BOX layer 204. A reflective layer 254 can be provided by, for example, using a reflective metal layer so that radiation that is not absorbed in a first pass through the charge collection region 206 is directed back through the charge collection region 206 so that it can be sensed by the photodiode 208. In the example of FIG. 2B, the imager is thinned to less than about 14 µm. The buried oxide layer 204 serves as an etch stop and an anti-reflection coating. Using the BOX layer 204 as an etch stop, lattice damage associated with thinning is confined to the interface of the substrate 202 and the buried oxide layer 204, and generally does not appear in the charge collection region 206. In this manner, thinning the detector does not degrade device operating characteristics.

For short wavelength radiation, including ultraviolet, vacuum UV, and soft x-rays, as well as energized electrons, the detector is typically less than about 3 microns thick and is doped to be nearly depleted at low operating voltages. After removal of the substrate 202 by mechanical processes and a selective chemical etch, the buried oxide layer 204 can be removed by the chemical etch to expose the first silicon layer 206 to prevent absorption of electromagnetic and particle radiation in the buried oxide layer 204 and allow more efficient collection in the charge collection layer 206.

FIGS. 2A–2B are representative examples of double SOI based imagers that include p+/n photodiodes. Pixels in these examples include a low-doped, high resistivity n-type silicon layer 206, and SOI transistors 234 and 240 on silicon islands 230 and 232 that are separated from the charge absorption layer 206 by an insulator layer 241 such as a buried oxide layer. The buried oxide layer 241 can be formed, for example, of silicon dioxide.

Figure 2C:
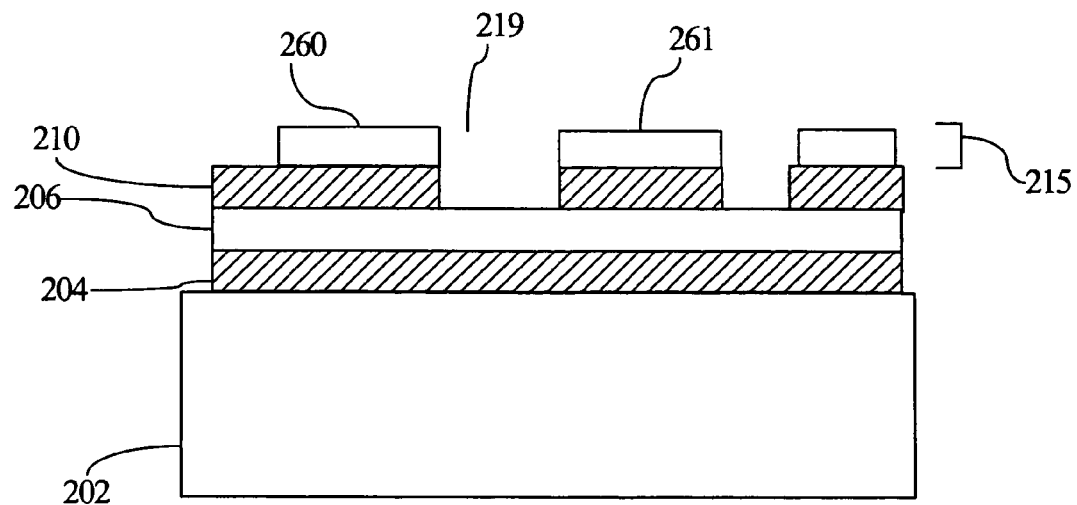
FIG. 2C is a schematic diagram of the substrate of FIG. 1B with portions of the second buried oxide layer removed to form windows exposing the first silicon layer
Figure 2D:
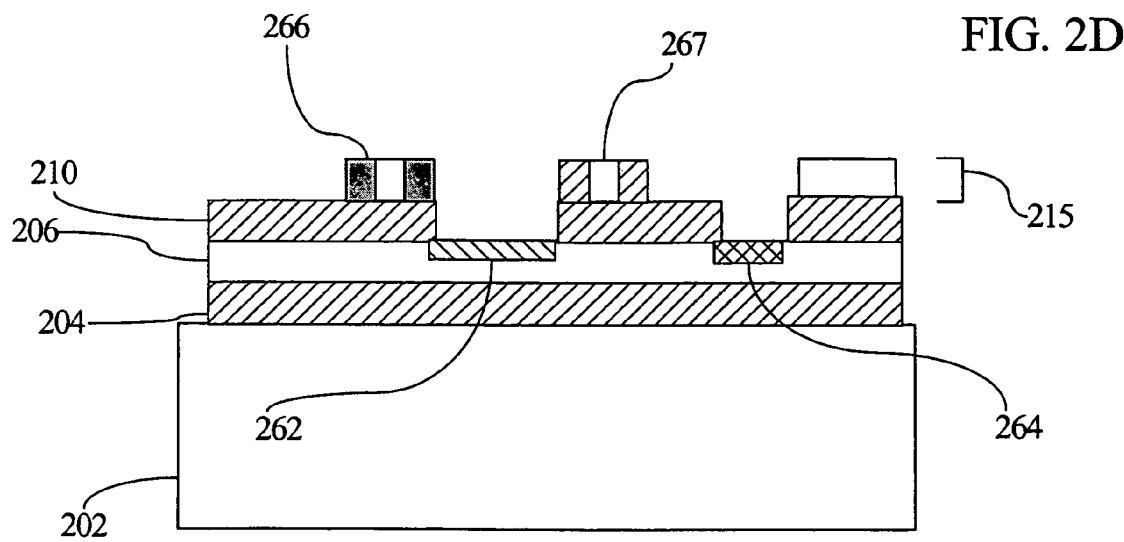
FIG. 2D is a schematic diagram illustrating dopants implanted through the windows of the second buried oxide that simultaneously dope transistors on silicon islands formed in the second silicon layer.

As is shown in FIG. 2C, the buried oxide 210 can be selectively etched to form an aperture 219 at silicon islands 260, 261. As shown in FIG. 2D, a dopant implantation or diffusion region 262 can be used to define a photodetector. A separate dopant implant or diffusion region 264 can be made to form a contact to bias the first silicon layer 206 and to form guard rings around the photodiode. The dopant implant or diffusion processes used to dope the layer 206 can be performed simultaneously with the implant used to define the source and drain in transistors 266, 267 in the circuits of formed in the second silicon layer 215.

Figure 2E:
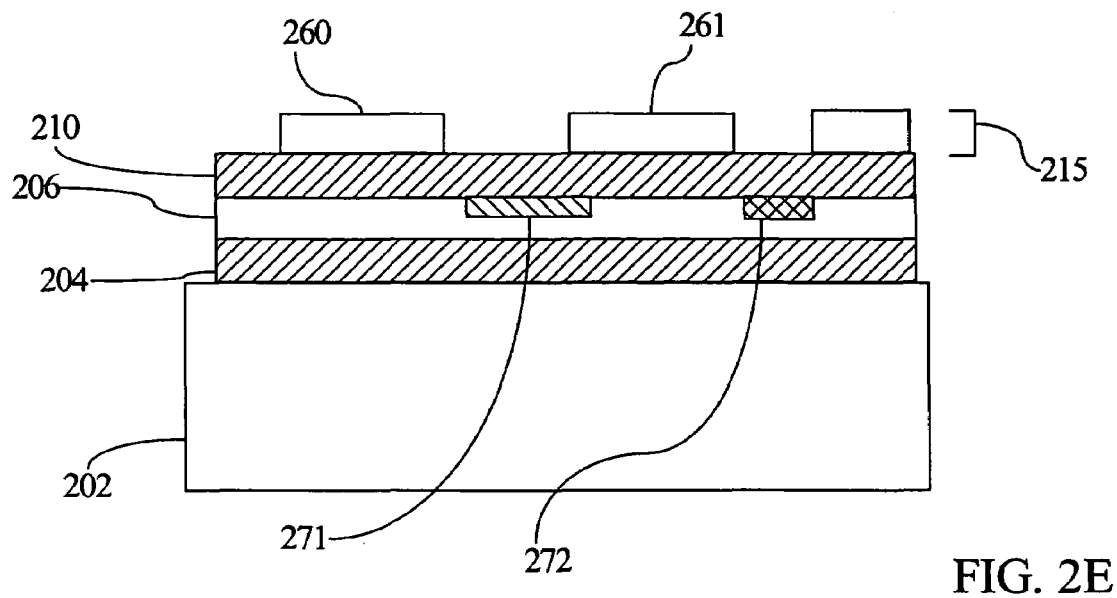
FIG. 2E is a schematic diagram illustrating dopants implant through the second buried oxide of FIG. 1B.

In another example, as shown FIG. 2E, dopant implants 270, 271 are preferably implanted through the buried oxide layer 210, so that the planar topology of the wafer is maintained for efficient semiconductor processing. In subsequent processing, the BOX layer 210 can be etched and electrical contact made to the first silicon layer 206.

Figure 2F:
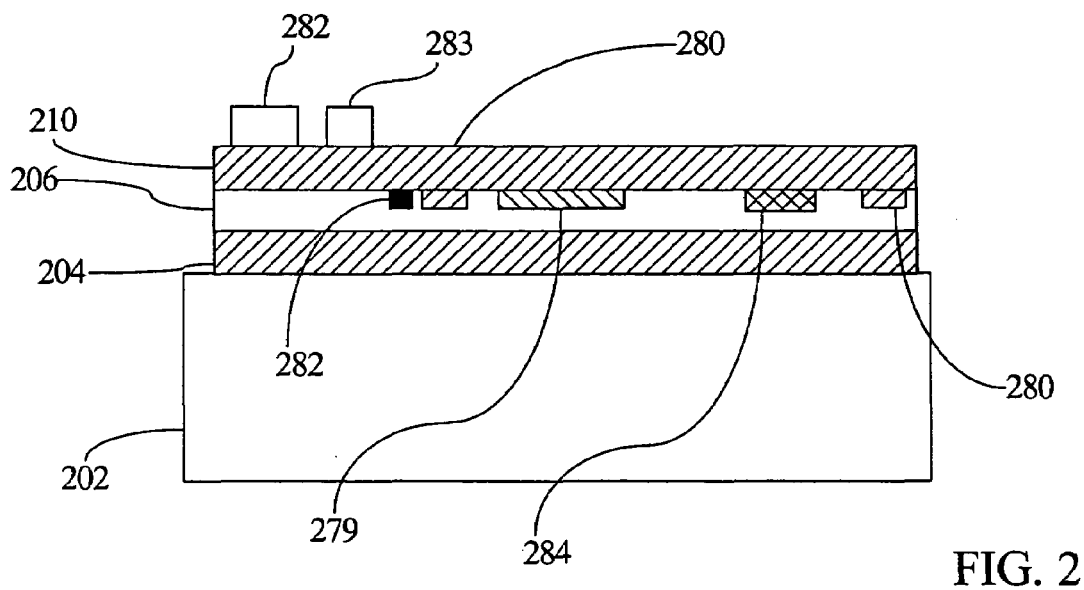
FIG. 2F is a schematic of a field implant through the second buried oxide of FIG. 1B to reduce leakage current and improve photodiode implant isolation.

As is shown in the example of FIG. 2F, a photodetector 279 can be surrounded by implantation regions as junction guard rings 280 or as trench guard rings to provide pixel-to-pixel isolation. These implanted regions can either be left floating or can be contacted and biased by etching the buried oxide layer 210 and making electrical contact to the implant. An optional field n-type field doping 282 can be provided through the buried oxide 210 not covered by silicon islands 283, 284 to accumulate charge at the interface between the first silicon layer 206 and the second buried oxide 210 to reduce dark current and increase the isolation between photodiodes.

The first silicon layer 206 can be optimized for the application independently from the second silicon layer 215. For example, a deep depleted region for photocurrent collection can be made by using, for example, an n-type dopant concentration of less than about $2*10^{13}/cm^3$ for the buried charge collecting layer or layers to provide a depletion width of approximately 20 µm for a 3.3 V bias. A high resistivity substrate promotes high quantum efficiency through the increase in depletion width, thereby resulting in efficient optical collection. One or both of the surfaces of the charge collection layer can be doped during wafer fabrication or during semiconductor processing to reduce leakage currents or to provide a conductive electrical contact to the silicon layer.

Double SOI substrates for fabrication of such imagers can be configured so that charge collection layers are selected based on a particular imager application. For example, electrons having energies less than about 5 KeV are efficiently absorbed in silicon layers about 1 µm thick. For high efficiency signal collection of visible optical radiation, thickness of approximately 12 µm are preferred. For near-infrared photons of wavelengths near the silicon bandgap, thicknesses greater than about 200 µm are preferred. Charge collection layers can be n- or p-doped at low doping concentrations (for example, less than about $10^{13}/cm^3$) to create a high resistivity layers.

To reduce the effects of leakage currents, the use of n-type material with thermally grown oxide layers is preferred because the positive charge trapped in the oxide layers 210 and 204 results in accumulation in the n-type first silicon layer 206 at the interface with the BOX 210 and 204. The accumulated surface charge at the interface between the first silicon layer 206 and the buried oxide layers 210 and 204 can increase the isolation between the p+/n photodiodes 208, and decrease leakage currents. In addition, it is well established that in an ionizing radiation environments, oxide layers, such as the layers 210, 204, are charged positively, which for an n-type silicon charge collection layer 206 can further increase the isolation of photodiode elements and improve detector radiation hardness.

Instead of doping the silicon to produce an n-type silicon wafer in the conventional manner, n-type silicon can be prepared by neutron bombardment to transmutate some of the silicon atoms into phosphorous atoms. This type of silicon is characterized by excellent doping uniformity and a low number of lattice defects. The transmuted n-type silicon can be used in wafer manufacturing to form the layer 206.

A thickness of the BOX layer 210 can be selected based on SOI CMOS foundry requirements as well as radiation performance requirements. To facilitate implantation of dopants into the first silicon layer 206 through the second BOX 210 layer, it is preferred that the BOX layer 210 be thin, for example, less than 190 nm thick. In some examples, portions of a BOX layer 210 can be selectively removed to permit incident radiation to reach a charge collection region without obstruction by the BOX layer.

For front illumination, the BOX layer 204 can be selected to reflect photons transmitted by the charge collection layer 206 back to the charge collection layer, effectively doubling the thickness of the charge collection region. For back-illumination, the BOX layer 204 can be selected to provide an air-to-silicon, anti-reflection coating for back illumination or can be removed to transmit photons or particles that would otherwise be absorbed in the BOX layer 204.

Figure 2G:
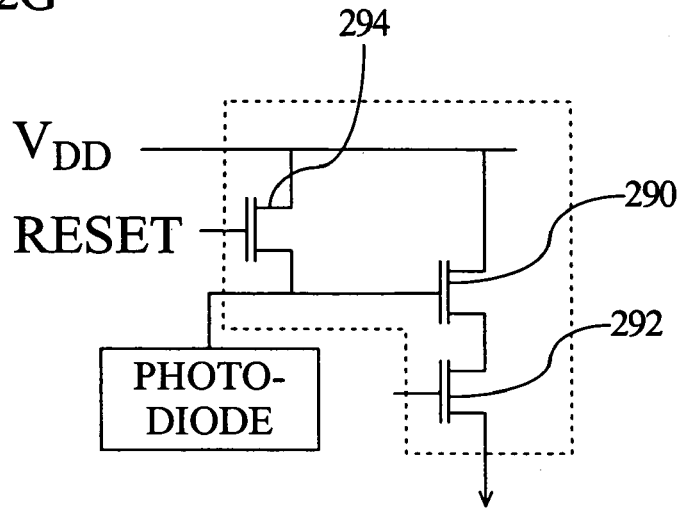
FIG. 2G is a schematic diagram illustrating representative readout circuitry for imagers such as those shown in FIGS. 2A–2B.

FIG. 2G illustrates representative readout circuitry that can be defined in one or more SOI layers. A source follower transistor 290 is connected in series with a row selection transistor 292 so that when the row selection transistor is turned on, the pixel signal is transferred to a column bus. A reset transistor 294 can be implemented, for example, as a p-type field transistor (FET) to provide higher charge handling capacity and, thus, a high dynamic range. The reset transistor 294 can allow the pixel to be reset to the power supply voltage without latch-up.

Figure 3C:
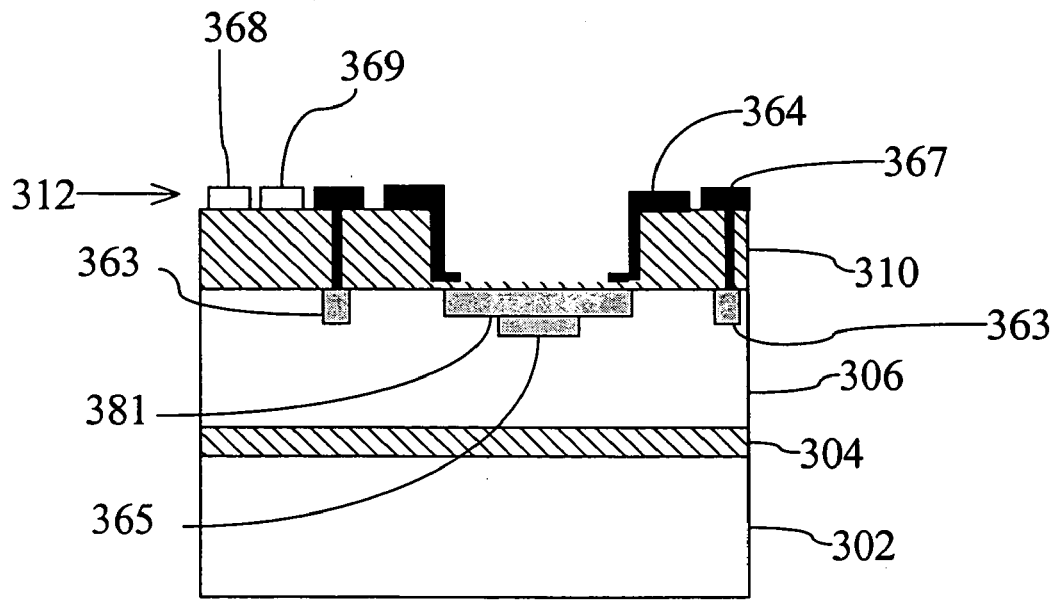
FIG. 3C illustrates construction of a representative avalanche photodiode detector FIG. 3D illustrate construction of a representative back-illuminated vertical avalanche photodiode detector.
Figure 3A:
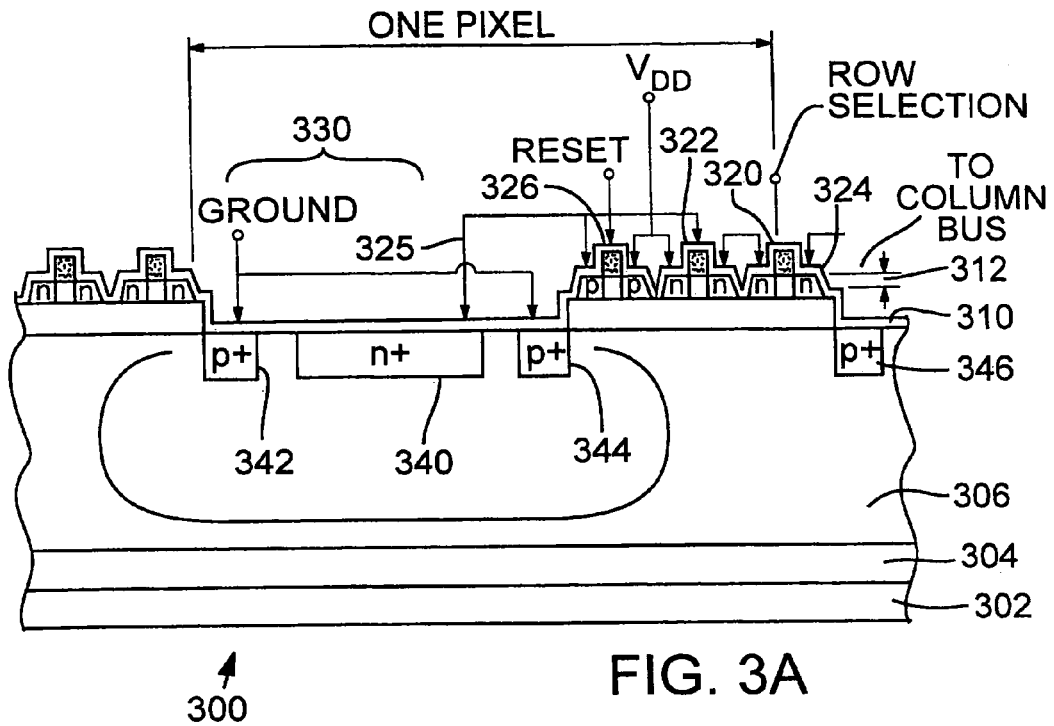
FIG. 3A illustrates construction of a representative photodiode detector.

A representative low-noise photodiode-type semiconductor device 300 is shown in FIG. 3A and includes a lightly doped p-type silicon layer 306 situated on a BOX layer 304 formed on a silicon substrate 302. SOI transistors 320, 322, 324 are formed using a SOI layer 312 situated on a BOX layer 310. An n+ photodiode 340 is formed by implanting or diffusing dopants into the first silicon layer 306 and then activating the dopants through thermal annealing processes. Representative doped regions 340, 342, 344, 346 are shown. The BOX layer 310 is selectively etched to form a window 330 to allow optical radiation to reach the charge collection region 306 and produce an interconnection (shown schematically as (322) between the photodiode 340 and the SOI transistors 322.

Figure 3B:
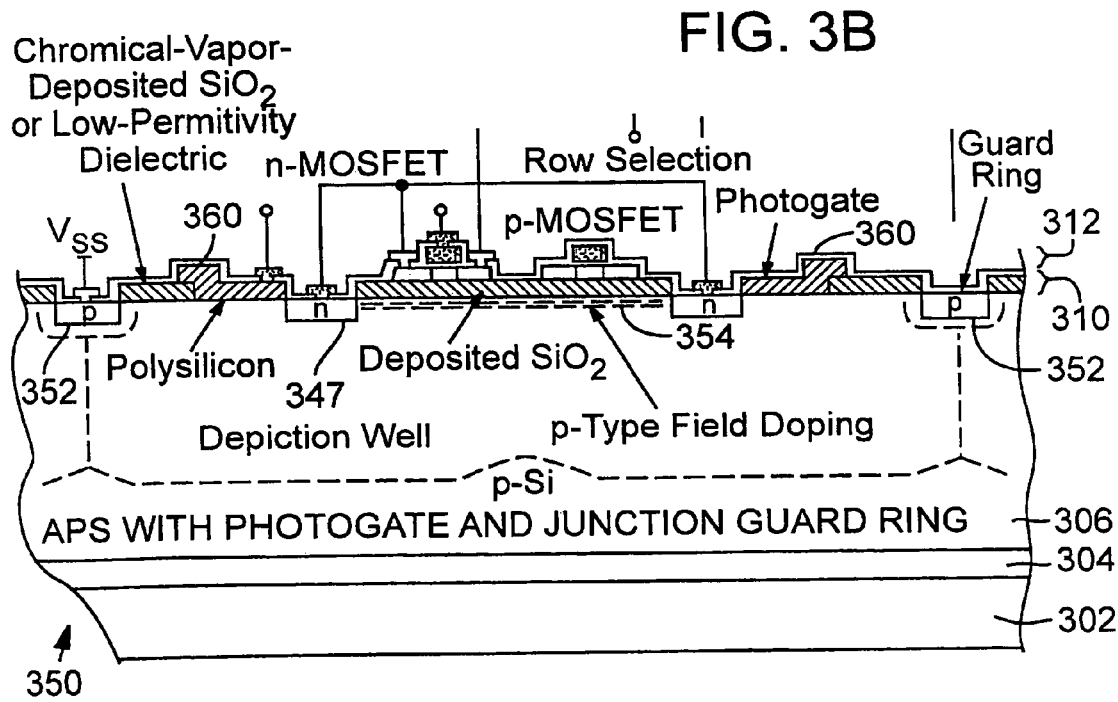
FIG. 3B illustrates construction of a representative photogate detector.

A representative low-noise photogate-type semiconductor device 350 is shown in FIG. 3B. Polysilicon gates 360 can be used to define a photogate photodetector. An absorption region can be provided with p+ implantation isolation regions 352 for pixel-to-pixel isolation, and an optional p-type field doping 354 can be provided for surface passivation to reduce dark current. Isolation regions can be formed as, for example, junction guard rings or trench guard rings. The device 350 can include reset transistors, buffer transistors, and row selection transistors for one or more pixels, as well as an additional transistor having a transfer gate. Charges collected under the polysilicon gates can be transferred to a sense node via a floating n+ diffusion region 347. The sense node can be situated in a SOI layer above the charge collection region to permit an implementation capable of in-pixel, correlated double sampling readout, and can exhibit low noise. In correlated double sampling (CDS), two samples are taken in a single pixel read-out cycle, one when the pixel is still in a reset state, and the other when charge has been transferred to a read-out node. These two samples are then used as differential signals in further signal processsing stages A representative lateral avalanche photodiode device 361 is shown in FIG. 3C. Avalanche photodiode p-type cathode dopants 365 and anode dopants 363 are made through the buried oxide 310 into the charge collection layer (the silicon layer 306) or are diffused through windows made by etching the buried oxide layer 310. N+ contact dopants are implanted and thermally activated to form a cathode contact 381. A cathode bias can be applied through a metal bias conductor 364. An anode bias can be applied to a metal bias conductor 367. Circuits for sensing and reading out the avalanche photodiode can be defined in silicon islands 368, 369. Such circuitry can also include time of flight and pulse amplitude sampling circuits such as are desirable for laser radar (LADAR) systems.

Figure 3D:
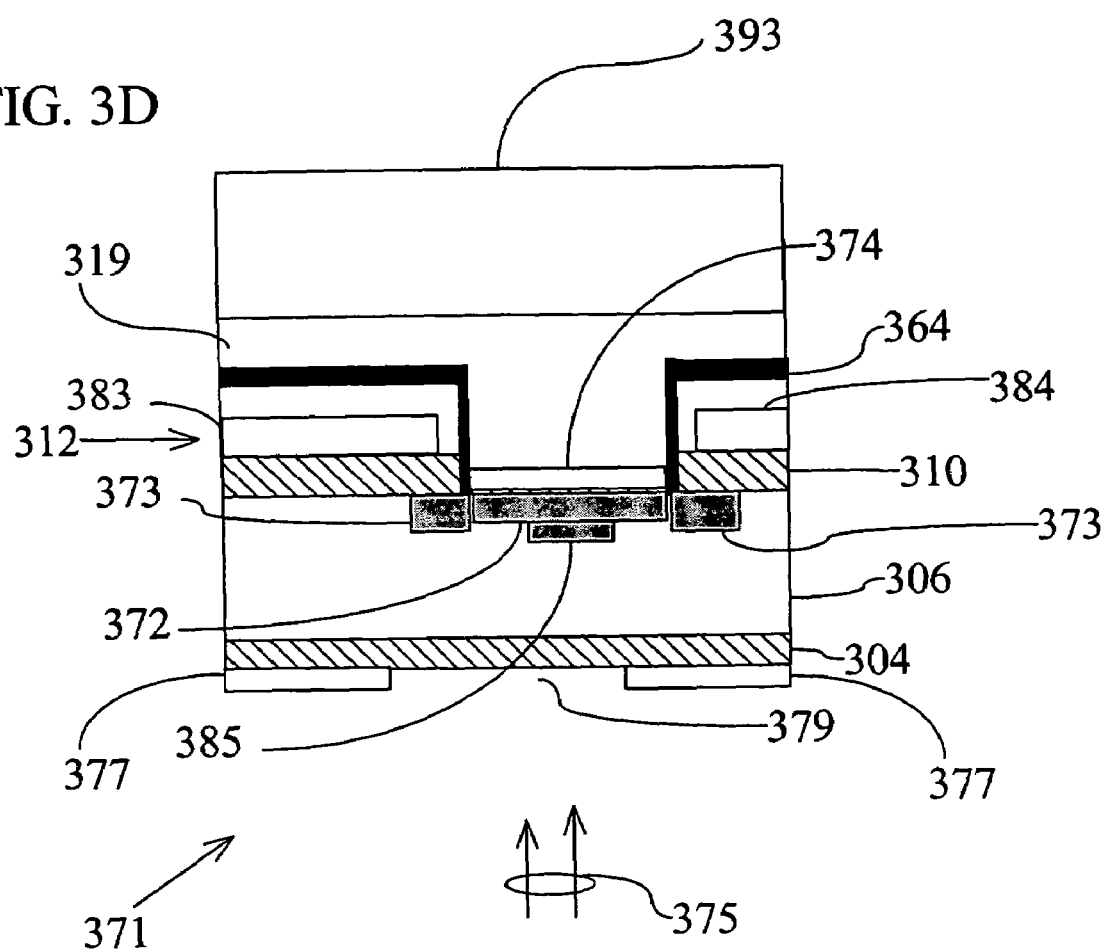

A representative back illuminated avalanche photodiode device 371 is shown in FIG. 3D. Flux 375 such as from optical or x-ray photons enters through an aperture 379 and is collected in charge collection region defined in the silicon layer 306, which in this example, is doped p-type so as to cause electron initiated avalanche events. The device is doped in apertures in the silicon layer 312 opened by creation of silicon islands 383 and 384 in which circuits are formed and through the buried oxide layer 310. An n+ implant 372 is created to contact the cathode. A P-type implant 385 is implanted through the buried oxide layer 310 to create a cathode. Bias is applied to the cathode through an interconnect 373. Reflective layer 374 can include a metal interconnect layer 373 is deposited over the top of the front surface of the device to allow optical radiation to reflect back through the charge collection layer 306. The device is planarized with a suitable fill material 319 and is mounted to a substrate 393 such as a silicon wafer or quartz wafer. The device can be thinned by removing the first silicon layer and the first buried oxide layer to expose the charge collection silicon layer 306. Metal contacts 377 are formed to provide bias to the device anode.

The basic structure of an SOI wafer comprises of thin film of active single crystalline silicon on a silicon dioxide dielectric layer at the top of a silicon wafer. SOI wafers are typically made in one of two ways, either through separation by implanted oxygen (SIMOX) or wafer bonding. During the SIMOX process, a high-dose oxygen implant is performed, and through subsequent high-temperature annealing (in excess of 1000° C.) a buried oxide layer is formed beneath the surface Si layer. Wafer bonding involves bonding of precleaned hydrophilic surfaces of two mirror polished wafers at room temperature, followed by annealing at elevated temperatures. In another technique called Bond and Etch SOI technique (BESOI), two silicon wafers are bonded together at an oxide interface and one of the silicon wafers is polished down to the final single crystal silicon device layer thickness. A so-called UNIBOND technique combines the wafer bonding and ion implantation technique. Oxidation is used to define the BOX layer and establish a BOX layer thickness. Hydrogen ions are implanted to define the device layer thickness. Both the box layer and the device layer thicknesses are variable and can be well controlled. A polishing step sets the surface roughness, and can be based on conventional CMP (Chemical Mechanical Polishing) technology as that for current bulk wafers to produce surface roughness of less than about 0.15 nm.

Figure 4A:
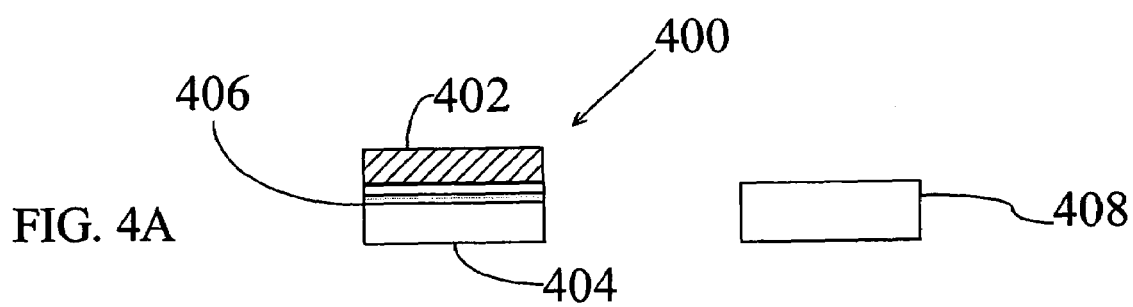
FIGS. 4A–4D illustrate a representative method for fabrication of a double SOI substrate.
Figure 4B:
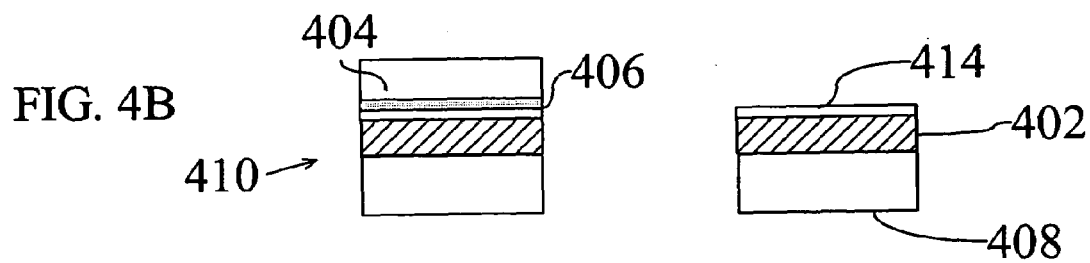
Figure 4C:
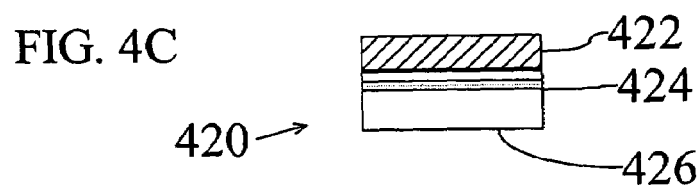
Figure 4D:
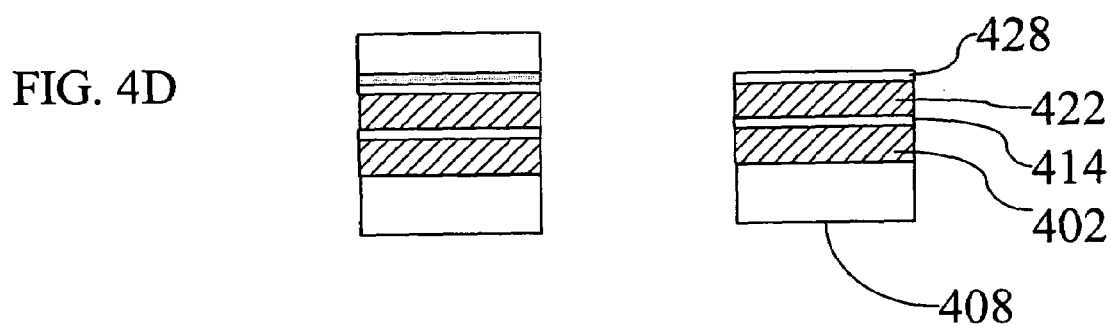

A representative method of fabricating a double silicon-on-insulator wafer (a "double SOI" wafer) is illustrated in FIGS. 4A–4D. As shown in FIG. 4A, a substrate 400 includes an oxide layer 402 that is formed on a silicon substrate 404, and includes a hydrogen implant region 406. Referring to FIG. 4B, the oxide layer 400 is contacted to a second silicon substrate 408 so that the SOI substrate 400 and the silicon wafer 408 are bonded by, for example, a hydrophilic bond to form a bonded substrate 410. The bonded substrate 410 is processed in a two-phase heat treatment to split the bonded substrate 410 at the hydrogen implant region 408 to form a SOI substrate 412 that includes the silicon substrate 408, the oxide layer 402, and a silicon layer 414 obtained from the substrate 404. A second high temperature treatment of the SOI substrate can be provided to strengthen bonding of the silicon layer 414. As shown in FIGS. 4C–4D, a substrate 420 that includes an oxide layer 422, a hydrogen implant region 424, and a silicon substrate 426 can be contacted to the SOI substrate 412 as described above to form a double SOI substrate 430 that includes the silicon substrate 408, the oxide layers 402, 422, the silicon layer 414, and a silicon layer 428. Typically, the silicon layers 414, 428 that are associated with splitting at a hydrogen implant region are chemo-mechanically polished to control surface topography.

Figure 4E:
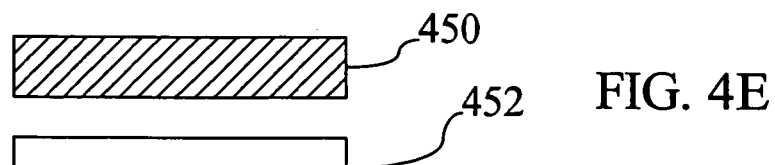
FIGS. 4E–4I illustrate an alternative representative method for fabrication of a double SOI substrate.
Figure 4F:
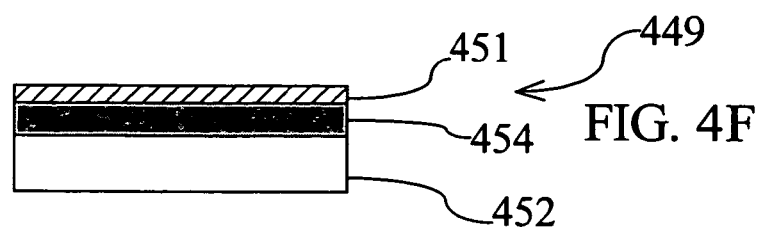
Figure 4G:
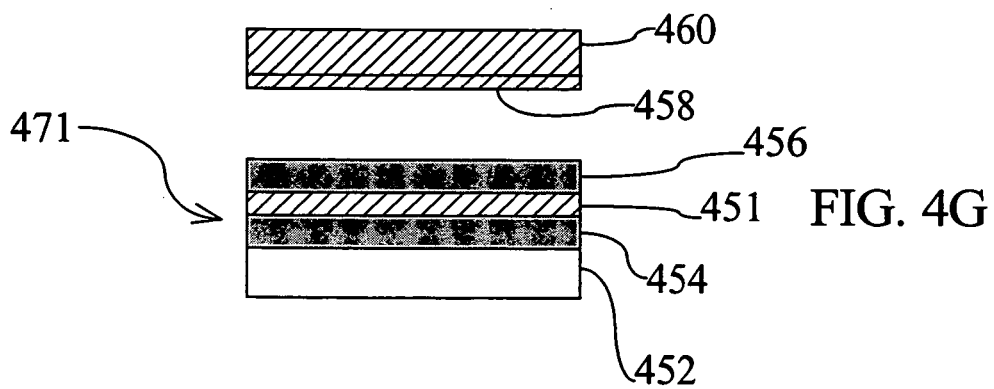
Figure 4H:
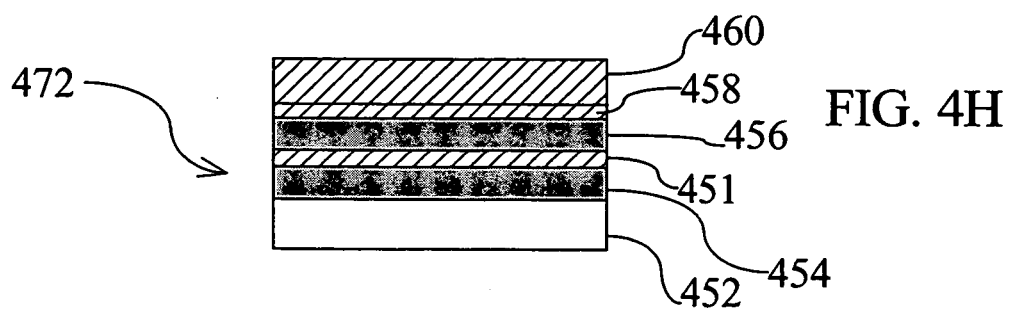
Figure 4I:
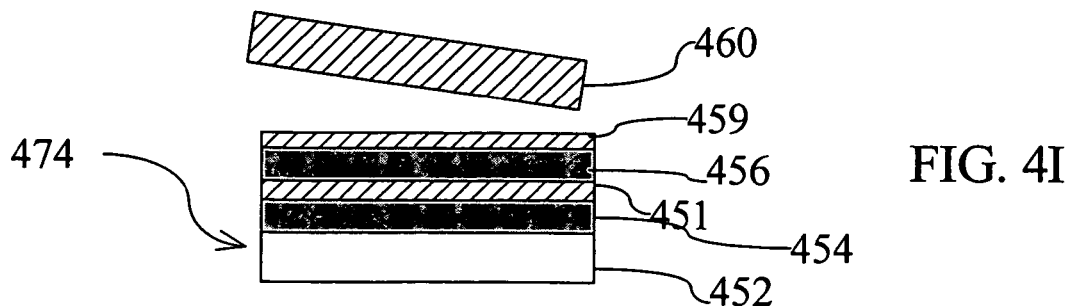

A preferred method of fabricating a double silicon-on-insulator wafer is illustrated in FIGS. 4E–4I. As shown in FIGS. 4E–4F, a silicon substrate 450 is provided with a thermal oxide layer 454, and a surface of the oxide layer 454 is contacted to a second silicon substrate 452 to form a composite substrate 449. The silicon substrate 450 of the composite substrate 449 is chemically and mechanically etched to a specified thickness and is polished using conventional silicon wafer processing techniques to form a silicon layer 451. The thickness of the remaining the silicon layer 451 can be confirmed by measurement, and polishing/thinning continued as necessary. Referring to FIG. 4G, an insulator layer 456 such as, for example, silicon dioxide, is thermally grown on the surface of the silicon layer 451 to form a composite substrate 471. A second silicon substrate 460 that includes a hydrogen implant region 458 is fused to the insulator layer 456. The insulator layer 456 is typically contacted to the composite structure 471 so that composite structure 471 and the second silicon substrate 460 are bonded by, for example, a hydrophilic bond to form a bonded substrate 472 shown in FIG. 4H. The bonded substrate 472 is processed in a two-phase heat treatment to split the second silicon substrate 460 at the hydrogen implant region 458 so that an associated silicon layer 459 is formed, and the remainder of the second silicon substrate 460 can be removed to form a SOI substrate 474 shown in FIG. 4I. A second high temperature treatment of the SOI substrate 474 can be provided to strengthen bonding of the silicon layer 458 to the oxide layer 456.

Figure 4J:
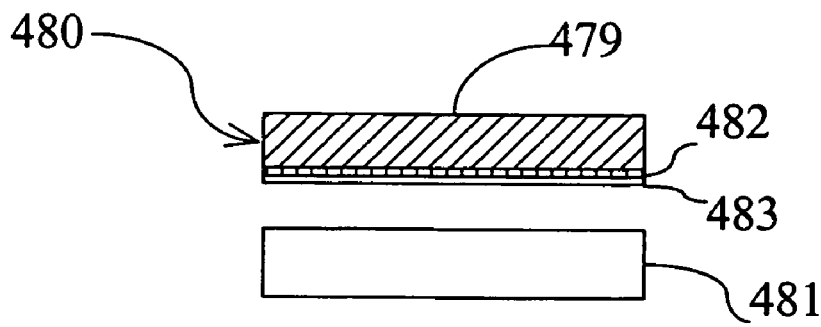
Figure 4K:
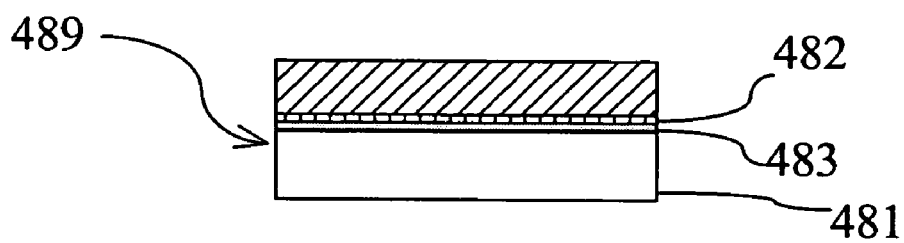
Figure 4L:
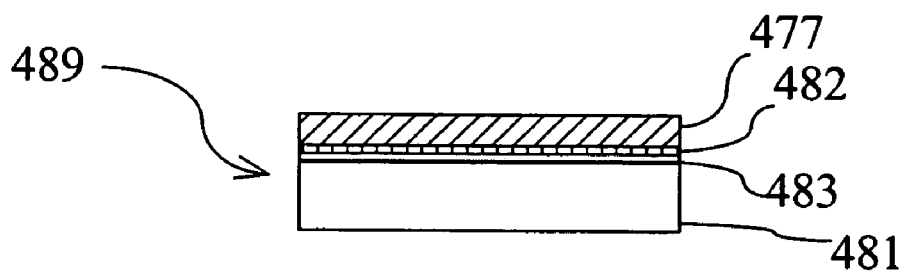
Figure 4M:
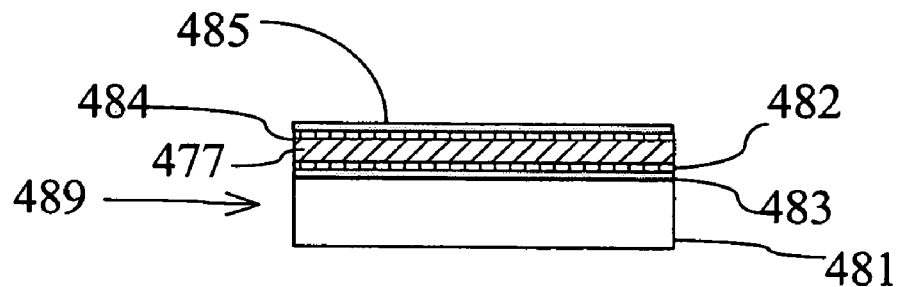

An exemplary method of fabricating a double silicon-on-insulator wafer modified during wafer manufacturing for enhanced photodetection is illustrated in FIGS. 4J–4O. As shown in FIG. 4J, a silicon substrate 479 is processed to include a doped region 482, and an oxide layer 483 is the formed on the silicon substrate 479 to form an oxidized, doped silicon wafer 480. The oxide layer 483 is contacted to a second silicon substrate 481, which may or may not have an oxide layer, so that the silicon substrate 481 and the silicon wafer 480 are bonded to form a composite substrate 489 as shown in FIG. 4K. Referring to FIG. 4L, the silicon substrate 479 of the composite substrate 489 can be chemically and/or mechanically etched to a specified thickness and polished using conventional silicon wafer processing techniques to produce a silicon layer 477. As is shown in FIG. 4M, dopants are implanted or diffused into a surface of silicon layer 477 and an oxide layer 485 is thermally grown on the surface of the silicon layer 477. As shown in FIG. 4N, a second silicon substrate 486 that includes a hydrogen implant region 491 is fused to the oxide layer 485 to form a composite SOI substrate 488, shown in FIG. 4O.

Figure 5A:
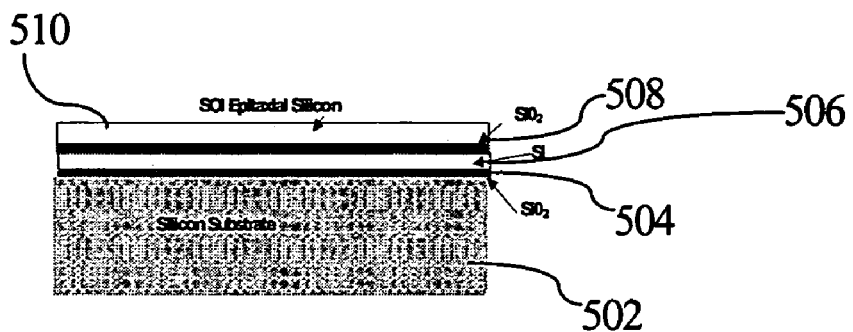
FIGS. 5A–5D illustrate a representative method for fabrication of a back-illuminated imager using a double SOI substrate.
Figure 5B:
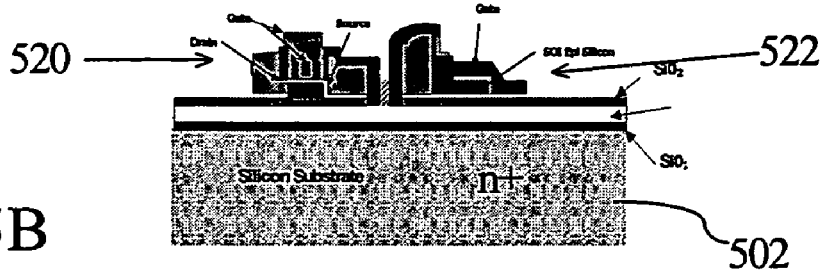
Figure 5C:
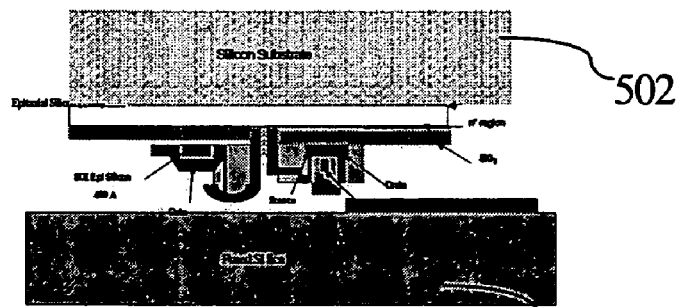
Figure 5D:
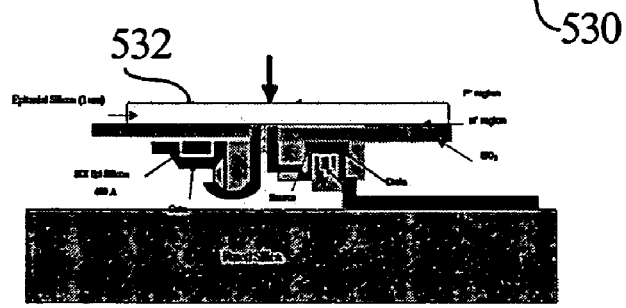
Figure 7:
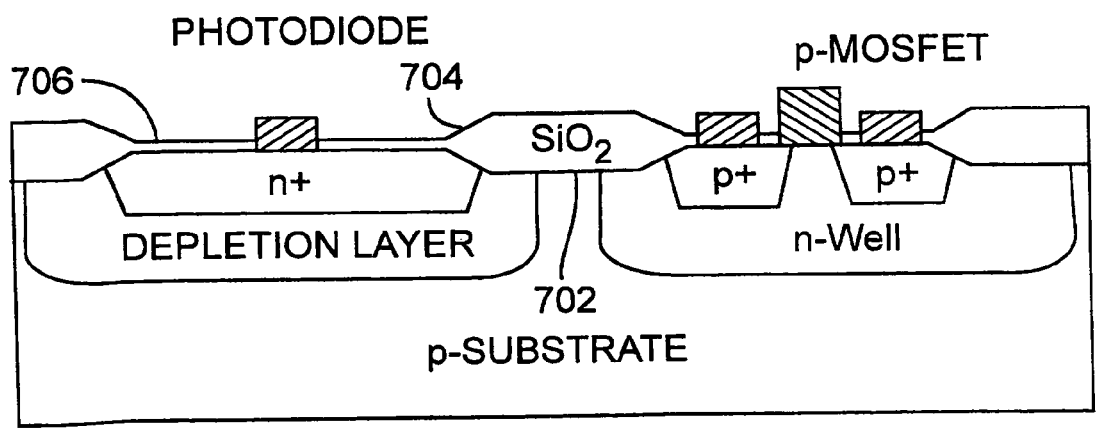
FIG. 7 is a sectional view of a prior art device formed on a bulk silicon substrate.

FIGS. 5A–5D illustrate a representative process for fabrication of a double SOI device. Referring to FIG. 5A, a double SOI substrate 500 is provided that includes a silicon substrate 502, oxide layers 504, 508, and SOI silicon layers 506, 510. In FIG. 5B, the double SOI substrate 500 is shown schematically as processed to produce a first transistor 520 and a second transistor 522 based on the silicon layer 510. An interconnect layer 524 and a passivation layer 526 are also shown. In addition, a photodetector 528 is defined in an aperture in the oxide layer 508 using an n+ doped region 529 of the silicon layer 506.

Compared to a conventional SOI CMOS process, the photolithographic masks used during etching of the buried oxide layer to provide the window areas and electrical contact for the photodetectors represents additional masking steps.

To fabricate a back-illuminated device, a surface of the wafer is fused, preferably at near room temperatures, to a handle substrate 530 and the silicon substrate 502 is removed. The handle substrate can be silicon, oxidized silicon, ceramic, glass, quartz, or other materials. Most of the silicon substrate 502 can be removed quickly by surface grinding. The remaining thick silicon layer 502 can be removed precisely, preferably by selective chemical etching, thereby uncovering the second surface of the bottommost charge collection layer 504. For silicon-based materials, potassium hydroxide (KOH) solutions can be used to selectively etch silicon using an $SiO_2$ etch stop.

The insulator layer can remain for surface passivation and/or as an anti-reflection coating, or as is shown in FIG. 5E, the insulator layer can be removed with a selective etch, using the silicon layer 506 as a stop etch. When required, or for applications including electron, soft X-ray, UV, or charged particle imaging, the oxide layer 504 can also be removed by selective chemical etching.

Room temperature bonding of a handle layer to a silicon front surface generally provides sufficient bond strength for subsequent scribing and cutting of a wafer into individual arrays. The bonding of the handle layer to the front layer can be accomplished using any of various methods, such as heating the surface of the front layer or using an adhesive. Such bonding processes are generally selected to reduce or avoid damage to imager circuitry. While a wafer can be backside thinned, in some examples, a processed wafer is diced prior to thinning.

The preceding methods permit fabrication of SOI-CMOS imagers that largely avoid problems associated with conventional imagers. A buried charge absorption layer doping can be selected independently of any doping requirements for transistor fabrication that is based on a different SOI layer. By keeping the buried charge absorption layer doping low, for example, on the order of about $10^{14}/cm^3$ or less, the depletion width of the photodetectors can made large at low bias voltages to decrease capacitance or to reduce diffusion related resolution degradation.

FIG. 6 shows a representative back-illuminated imager 600 configured for electron or charged particle imaging as well as light imaging. The imager 600 includes a silicon layer 602 in which charge collection regions 612 are formed, a buried oxide layer 604, and a silicon layer 606 that is used to define image processing circuitry 622. The imager is mounted to a handle substrate 608. Photodiodes such as a photodiode 620 can be provided that use the charge collection regions formed in the silicon layer 602. Interconnections 624 are provided through the layer 704. Such an imager can be produced by processing a topmost silicon layer of a double SOI substrate, and then removing the bulk silicon substrate for back illumination.

Photodetectors fabricated using the foregoing techniques can exhibit large collection efficiency and high absorption efficiency, both of which are required for high quantum efficiency. Absorption efficiency refers to the fraction of the photons absorbed in the silicon. By forming the photodetector in a buried silicon layer, the depletion width can be tailored using the reflective characteristics of a front surface reflective metal overlayer and/or the buried oxide to be greater than the absorption depth at visible wavelengths. Collection efficiency refers to the fraction of the photo-generated carriers collected at the photosite. Using the techniques described above, the photoelectrons are placed in a converging drift field that enables them to be efficiently collected at the surface. Furthermore, the presence of a vertical drift field renders lateral diffusion insignificant, causing low cross-talk, low smear, and a high modulation transfer function (MTF). The resultant pixel structure is highly planar. In contrast to bulk-CMOS technologies, the technique described above does not require LOCOS isolation. Furthermore, planarization of the pixel structure in conjunction with the use of thin-film SOI transistors for pixel readout can provide high radiation tolerance. Planarization can be particularly important in preventing a catastrophic rise in dark current caused by field-enhanced trapping and de-trapping of electrons at the interface. Furthermore, the pixel structure is inherently free from latch-up under radiation because the transistors are isolated from one another. The amount of dark current generated at the interface of the layer and the buried oxide may vary depending on the quality of the wafers. To reduce the dark current, a dark current sink can be provided. The dark current sink can be formed by providing an n+ region in the buried charge absorption layer in the vicinity of the SOI regions in which the photodetector readout circuits can be formed. The n+ region forms a reverse-biased p-n junction, which can sweep out dark current generated in the SOI regions.

Increased integration and high operating speeds can result from use of the SOI process by preventing the coupling of noise into sensitive nodes through the substrate. Therefore, high frequency digital circuits and radio frequency circuits can be located near an imager without the digital or other noise contaminating charge stored in the photosite. Such noise coupling is reduced or prevented by forming readout transistors on a buried oxide layer. The elimination or reduction of substrate noise coupling can result in increased packing density as well as high speed. Thus, high-speed pipelined system architectures can be used.

In contrast to bulk-CMOS processes, the SOI architecture allows incorporation of complimentary transistors in the pixel without fill-factor degradation. By using a p-FET pixel reset transistor, the voltage swing on the sense node can be more than twice the voltage swing obtained in a bulk-CMOS implementation. An increased voltage swing translates to a correspondingly larger charge handling capacity.

It will be appreciated that the preceding examples are illustrative only and are not to be taken as limiting. For example, double SOI based active pixels sensors can be configured so that, for example, charge coupled devices (CCDs) are formed. For back illuminated sensors, additional implants and/or passivation processes can be used after removal of the silicon substrate. The buried SOI silicon layer that is generally used as a charge sensor layer can be doped to be either n-type or p-type, and a doping can be selected to reduce dark currents and/or to be radiation tolerant. Active pixel sensors generally include arrays of charge sensors formed in a first silicon layer, and each charge sensor is associated with at least one transistor formed in second silicon layer. Readout circuitry can include reset switches, buffer switches, and row selection switches formed in the second silicon layer. A buffer switch can include a source follower transistor in communication with a row selection switch so that when the row selection switch is turned on, a signal from the sensor is transferred to a column bus. The reset switches can include a p-type MOS transistor. Signal processing circuit elements such as logic, random access memory, clock drivers, timing, and/or analog-to-digital conversion can be included. Photodetectors can be configured as photodiodes, photogates, such as, for example, p+n or n+p detectors, or p-i-n photodiodes or as avalanche photodiodes.

While examples are described with reference to silicon and silicon oxide layers, insulator layers can be formed of one or more different materials, or as a layer of a single material. Such insulator layers typically have thicknesses of less than about 0.25 µm. SOI silicon layers such as a topmost layer in which readout circuitry is defined generally have thicknesses in a range of about 0.1 µm to 1 µm. A SOI layer or layers associated with a photodetector can have n-type or p-type dopant concentrations in a range of about $10^{11}/cm^3$ to about $5 \cdot 10^{15}/cm^3$.

Various semiconductor processes for thin film deposition, ion implantation, and photolithographic patterning can be used to create readout circuitry and to define photodetectors or charge detectors. A handle layer that is convenient for device thinning can be attached at room temperature, and high temperature processes can be avoided. A handle layer can be formed of, for example, silicon, ceramic, glass, polymer, or metal. Generally, a surface of a SOI silicon layer associated with readout circuitry is planarized prior to applying the handle layer by, for example, spin-on-glass and dielectric deposition and chemical-mechanical polishing. A back-surface can be etched to expose bond pads associated with readout circuitry. Devices can be processed individually by dicing a SOI wafer, or an entire wafer can be fully processing before dicing.

Dopant can be implanted through the second insulating layer or through a window etched into the second insulating layer to form a field implant or isolation rings around a photodetector charge collection region, and a charge collection region can lightly doped n-type or p-type to be high resistivity. In addition, layers can be configured to enhance reflection of photons back through the charge collection region. In some examples, a first silicon layer thickness is based on a fraction of a wavelength of incident radiation to create a resonant cavity. Alternatively, one or more buried oxide layers can be configured to as reflectors. In back-illuminated examples, a metal layer can be deposited over the surface of the detector to form a reflector that can enhance reflection of photons back through the charge collection region.

One or both of the insulators contacting the first silicon layer can be thermally grown during the SOI wafer fabrication so that the positive charge associated with the thermally grown oxide can accumulated the first layer so that leakage currents are reduced and so that the photodiodes are isolated.

The first silicon layer can be doped n-type so that positive charge induced by ionizing radiation in the oxide layers, accumulates the interface of the first silicon layer and the oxide layers and increases the isolation of the photodiodes.

A SOI layer associated with charge collection can be configured to reduce dark current and prevent hysteresis by implanting the interface between the first insulating layer and the first silicon layer to impart a stable electric field that sweeps charge carriers to the photodiode created at the interface of the first silicon layer and the second insulating layer.

Biased electrically conductive layers can be put in close proximity to the second buried oxide to induce an electric field in the first silicon layer (the charge collection layer) to reduce the leakage current between the first silicon layer and the second buried oxide layer and to improve electrical isolation of detector elements.

Different charge collection regions can be defined in a single device or SOI substrate and configured to, for example, detect optical radiation of different wavelengths. Alternatively, first and second charge collection regions can be associated with detection of an optical wavelength and detection of electrons, respectively. Charge collection regions can be formed of layers of materials other than silicon, such as, for example, Ge, GaAs, InAlAs, InGaAs, InP, or SiGe.

Charge collection regions can be configured for detection of electrons or other charged particles, vacuum ultraviolet photons, x-rays, or other wavelengths. For example, for back illuminated devices, portions of a substrate through which inputs such as optical signals or charged particles are received can be removed or thinned using chemical etches, plasma etched, chemo-mechanical etches or other processes. The substrate can be substantially removed, or only selected portions that inhibit charged particles or optical signals from reaching a charge detector region can be removed.

It will be apparent that these examples can be modified in arrangement and detail without departing from the scope of the disclosure. We claim all novel and non-obvious combinations and subcombinations of the disclosed features and their equivalents, as set forth by the appended claims.

What is claimed is:

1. A method of making a semiconductor device comprising:
providing a multi-layer semiconductor-on-insulator (SeOI) wafer structure that includes a supporting substrate, a buried first semiconductor layer on the supporting substrate, a second semiconductor layer, and a buried insulator (BI) layer, wherein the second semiconductor layer is situated on the BI layer, and the BI layer is situated on the first semiconductor layer;
defining a radiation detection region in the first semiconductor layer;
defining a readout circuit element in the second semiconductor layer so as to be in communication with the radiation detection region in the first semiconductor layer; and
removing the supporting substrate.

2. The method of claim 1, further comprising selecting a thickness of the first semiconductor layer so as to substantially absorb incident radiation.

3. The method of claim 1, further comprising selecting a thickness of the first semiconductor layer so as to substantially absorb optical radiation.

4. The method of claim 1, further comprising doping at least one of the first semiconductor layer and the second semiconductor layer so as to have a non-uniform doping profile as a function of depth.

5. The method of claim 1, further comprising selecting the non-uniform doping profile based on a selected radiation absorption efficiency or a charge collection efficiency.

6. The method of claim 1, further comprising:
defining a window in the BI layer; and
defining a photodiode region in the buried first semiconductor layer and situated at the window in the BI layer.

7. The method of claim 6, further comprising defining an electrical contact between the first semiconductor layer and the second semiconductor layer associated with the window and the photodiode region.

8. The method of claim 1, further comprising doping the buried first semiconductor layer through the BI layer so as to form a doped photodiode region.

9. The method of claim 1, further comprising defining the readout circuit in the second semiconductor layer such that the readout circuit includes a source region and a drain region for a first transistor defined by a dopant of a first type and a source region and a drain region for a second transistor defined by a dopant of a second type.

10. The method of claim 1, further comprising configuring the first semiconductor layer and the second semiconductor layer to be operated at different bias levels.

11. The method of claim 1, further comprising forming a conductive region in proximity to the BI layer and situated to produce, in response to an applied voltage, an electric field in the first semiconductor layer.

12. The method of claim 1, further comprising:
attaching a handle substrate to the second semiconductor layer; and
removing the supporting substrate.

13. The method of claim 1, wherein at least one of the first layer and the second layer are silicon.

14. The method of claim 1, further comprising selecting at least one of the first semiconductor layer and the second semiconductor layer to not be silicon.

15. The method of claim 1, where at least one of the first semiconductor layer and the second semiconductor layer is selected to consist essentially of at least one of GaAs, InGaAs, InP, Ge, and SiGe.

16. A semiconductor device fabrication method, comprising:
defining a first buried charge collection region in a first semiconductor layer;
defining at least a second buried charge collection region in a second semiconductor layer;
defining a buried insulator layer situated between the first and second semiconductor layers; and
defining a readout circuit in electrical communication with the first and second charge collection regions.

17. A method of making a semiconductor device, comprising:
providing a supporting substrate, a first buried insulator (BI) layer situated on the supporting substrate, a first semiconductor layer situated on the first BI layer, a second BI layer situated on the first semiconductor layer, and a second semiconductor layer situated on the second BI layer;
forming a radiation detection region in the first semiconductor layer; and
forming at least one readout circuit element in the second semiconductor layer and configured to be in communication with the radiation detection region defined in the first semiconductor layer.

18. The method of claim 17, further comprising removing at least a portion of the supporting substrate to define a window associated with the radiation detection region.

19. The method of claim 18, further comprising:
attaching a handle substrate to the second semiconductor layer; and
removing the supporting substrate.

20. The method of claim 19, wherein the supporting substrate is removed using the second BI layer as an etch stop.

21. The method of claim 20, further comprising exposing the first semiconductor layer by removing at least a portion of the first BI layer using the first semiconductor layer as an etch stop.

22. The method of claim 21, wherein the first semiconductor layer includes a non-uniform doping.

23. The method of claim 17, wherein the first and second BI layers consist essentially of silicon dioxide.

24. The method of claim 23, further comprising doping the first semiconductor layer with at least one n-type dopant.

25. The method of claim 21, further comprising forming an antireflection coating on the exposed portion of the first semiconductor layer.

26. The method of claim 17, further comprising:
forming at least a first island and a second island in the second semiconductor layer;
selectively etching the second BI layer at a region associated with the radiation detection region; and
doping the first island with a first dopant of a first type and the second island with a second dopant of a second type to form source or drain regions of a first transistor and a second transistor, respectively.

27. The method of claim 17, further comprising:
doping at least a portion of the first semiconductor layer through the second BI layer at the radiation detection region to define a photodiode.

28. The method of claim 26, wherein the doping of at least one of the first and second semiconductor islands is performed as the first semiconductor layer is doped.

29. The method of claim 28, further comprising providing an electrical interconnection between one or more transistors of the second semiconductor layer and the radiation detection region of the first semiconductor layer.

30. The method of claim 17, further comprising:
forming at least a first semiconductor island and a second semiconductor island in the second semiconductor layer;
doping at least a portion of the first semiconductor layer to form a photodiode in the second semiconductor layer; and
doping at least a portion of the first semiconductor layer to reduce leakage current at an interface of the first BI layer and the first semiconductor layer.

31. The method of claim 17, further comprising:
bonding a handle substrate to the second semiconductor layer; and
removing the supporting substrate, the first buried insulator, the first semiconductor layer, and the second buried insulator so as to expose bond pads.

32. The method of claim 17, further comprising defining windows in the second semiconductor layer and the second buried oxide layer, wherein the windows are situated at the radiation detection region.

33. The method of claim 17, further comprising configuring the first BI layer to serve as an anti-reflection coating.

34. The method of claim 17, wherein at least one of the first and second BI layers are thermally grown silicon dioxide layers.

* * * * *